United States Patent
Gandhi et al.

(10) Patent No.: US 6,448,631 B2
(45) Date of Patent: *Sep. 10, 2002

(54) CELL ARCHITECTURE WITH LOCAL INTERCONNECT AND METHOD FOR MAKING SAME

(75) Inventors: Dhrumil Gandhi, Cupertino; Lyndon C. Lim, San Jose, both of CA (US)

(73) Assignee: Artisan Components, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/159,264

(22) Filed: Sep. 23, 1998

(51) Int. Cl.[7] ............................... H01L 23/58
(52) U.S. Cl. ................. 257/635; 257/211; 257/754; 257/758
(58) Field of Search ............... 257/635, 637, 257/202, 211, 754, 758

(56) References Cited

U.S. PATENT DOCUMENTS

| | | | |
|---|---|---|---|
| 4,329,706 A | 5/1982 | Crowder et al. | 257/735 |
| 4,507,847 A * | 4/1985 | Sullivan | 29/576 B |
| 4,908,332 A * | 3/1990 | Wu | 437/192 |
| 4,937,657 A * | 6/1990 | DeBlasi et al. | 357/71 |
| 5,283,760 A | 2/1994 | Chin et al. | 365/189.01 |
| 5,485,031 A | 1/1996 | Zhang et al. | 257/751 |
| 5,642,324 A | 6/1997 | Ghosh et al. | 365/230.03 |
| 5,680,357 A | 10/1997 | Sung et al. | 365/210 |
| 5,783,480 A | 7/1998 | Seo et al. | 438/599 |
| 5,808,933 A | 9/1998 | Ross, Jr. et al. | 365/156 |
| 5,831,919 A | 11/1998 | Haukness et al. | 365/205 |
| 5,892,725 A | 4/1999 | Lattimore et al. | 365/230.03 |
| 5,907,781 A * | 5/1999 | Chen et al. | 438/303 |
| 5,917,744 A | 6/1999 | Kirihata et al. | 365/63 |
| 5,973,376 A | 10/1999 | Rostoker et al. | 257/204 |
| 5,987,086 A * | 11/1999 | Raman et al. | 375/500.02 |
| 6,031,288 A * | 2/2000 | Todorobaru et al. | 257/754 |
| 6,130,470 A * | 10/2000 | Selcuk | 257/534 |
| 6,239,491 B1 * | 5/2001 | Pasch et al. | 257/750 |

* cited by examiner

*Primary Examiner*—Sara Crane
(74) *Attorney, Agent, or Firm*—Martine & Pennilla, LLP

(57) ABSTRACT

Disclosed is a semiconductor standard cell architecture with local interconnect. The standard cell architecture includes a semiconductor substrate having diffusion regions that are designated for source and drain regions of a functional circuit. The standard cell also includes a polysilicon layer that is patterned to define gate electrodes and interconnections of the semiconductor standard cell architecture. In addition, the standard cell includes a local interconnect metallization layer that is patterned into a plurality of local interconnect metallization lines that are configured to be disposed over the semiconductor substrate and are further configured to substantially interconnect the source and drain regions and gate electrodes to define the functional circuit. The plurality of local interconnect metallization lines are further designed to incorporate local interconnect metallization pins that are connection points for interconnecting the functional circuit to another functional circuit. In a preferred embodiment, the local interconnect metallization lines are configured to be fabricated from a higher resistivity metal having a resistivity that is greater than aluminum containing metals.

18 Claims, 38 Drawing Sheets

LOCAL INTERCONNECT CELL LIBRARY EXAMPLE

| | |
|---|---|
| D FLIP FLOPS | SC 108, SC 108, ... |
| NAND GATES | SC 108, SC 108, SC 108, ... |
| NOR GATES | SC 108, SC 108, SC 108, ... |
| INVERTERS | SC 108, SC 108, SC 108, ... |
| OTHER LOGIC ⋮ | OTHER CELLS ⋮ |

FIG. 2

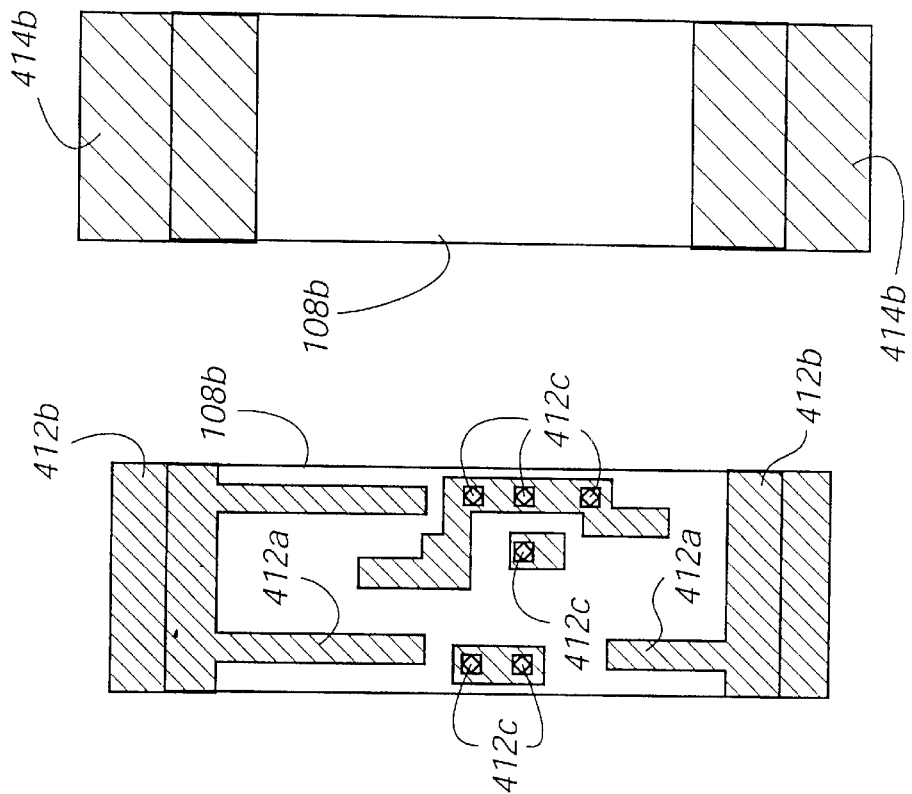
Fig. 14
Fig. 13
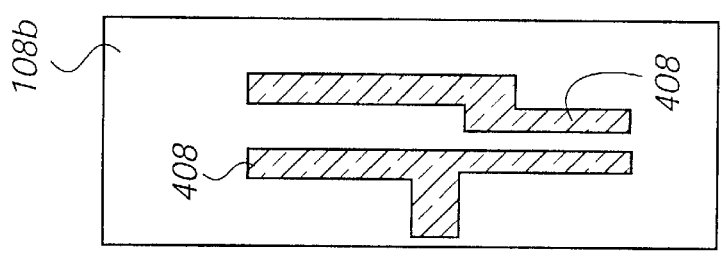
Fig. 12
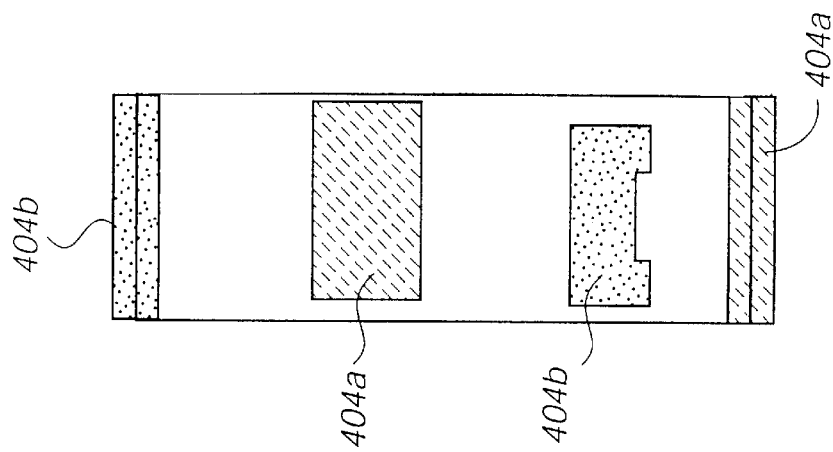
Fig. 11

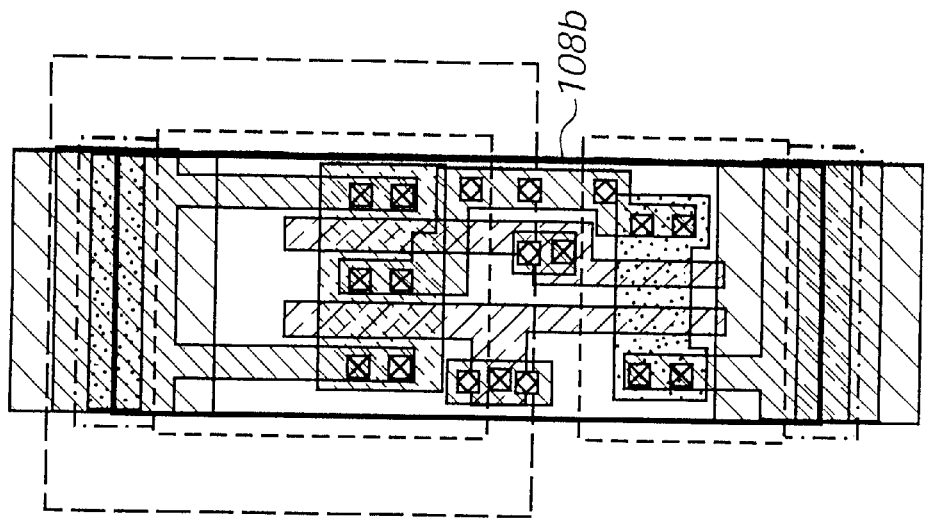
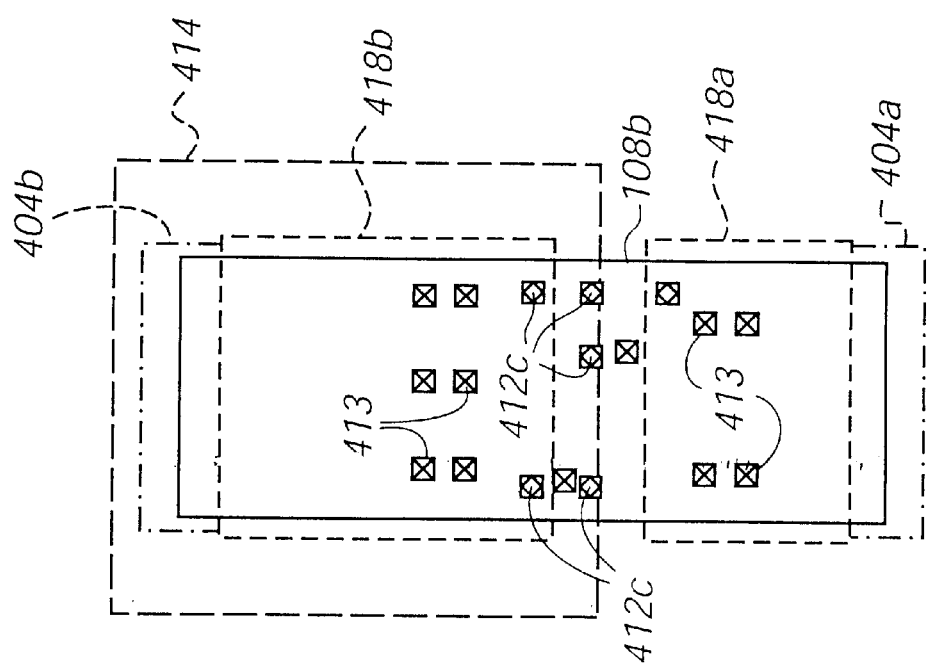
Fig. 16
Fig. 15

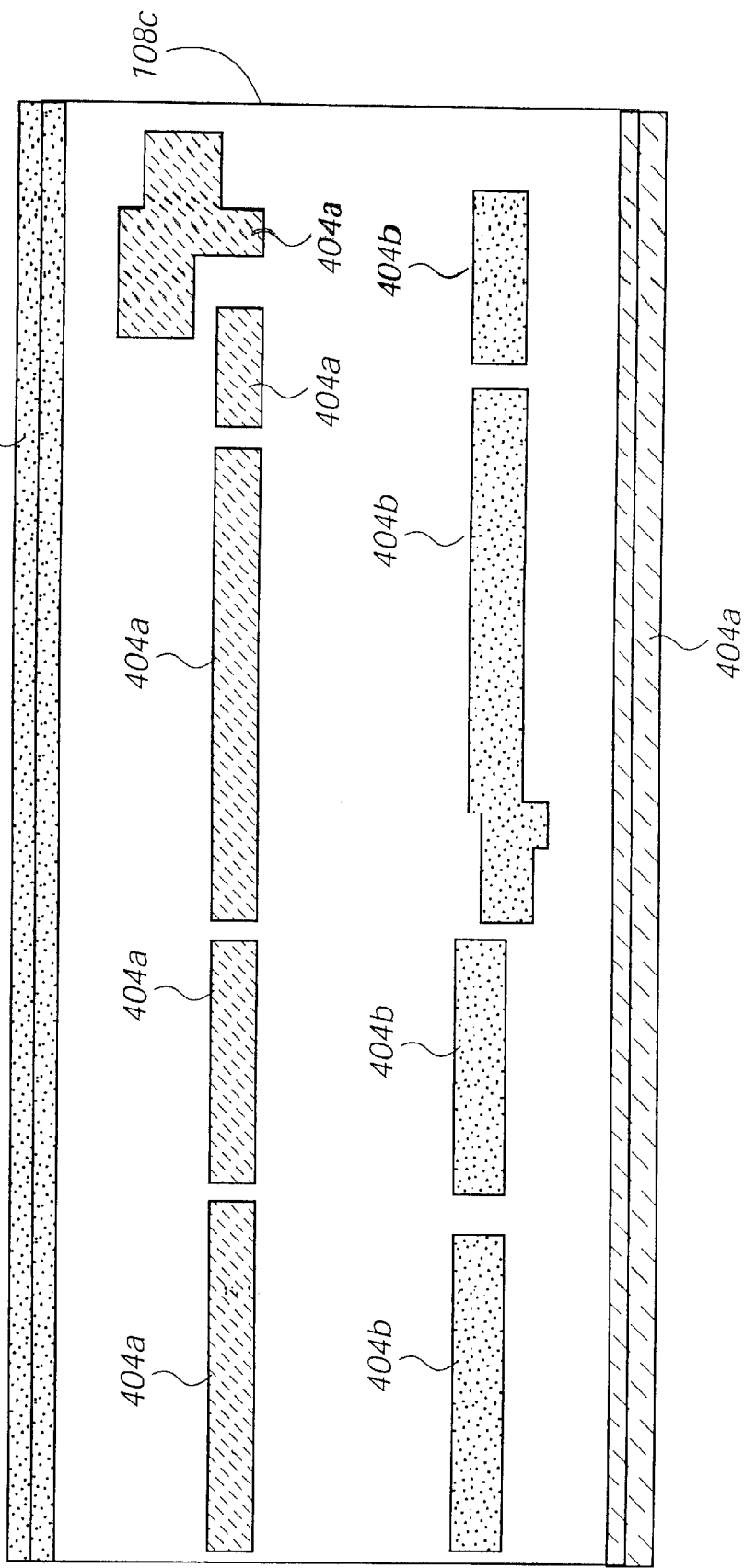

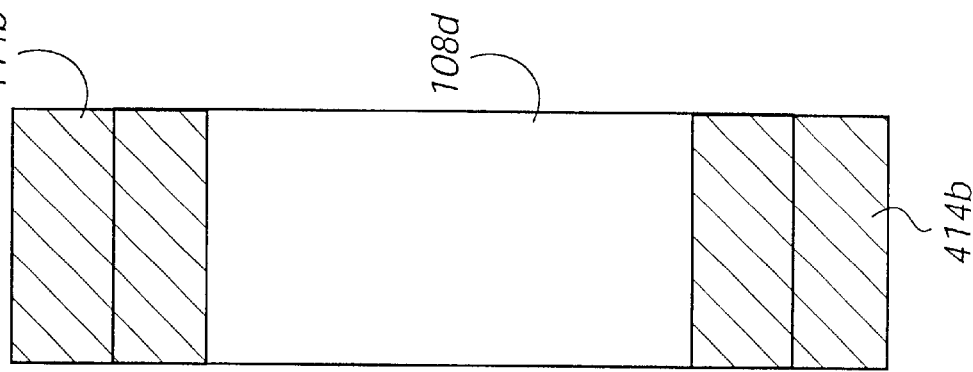
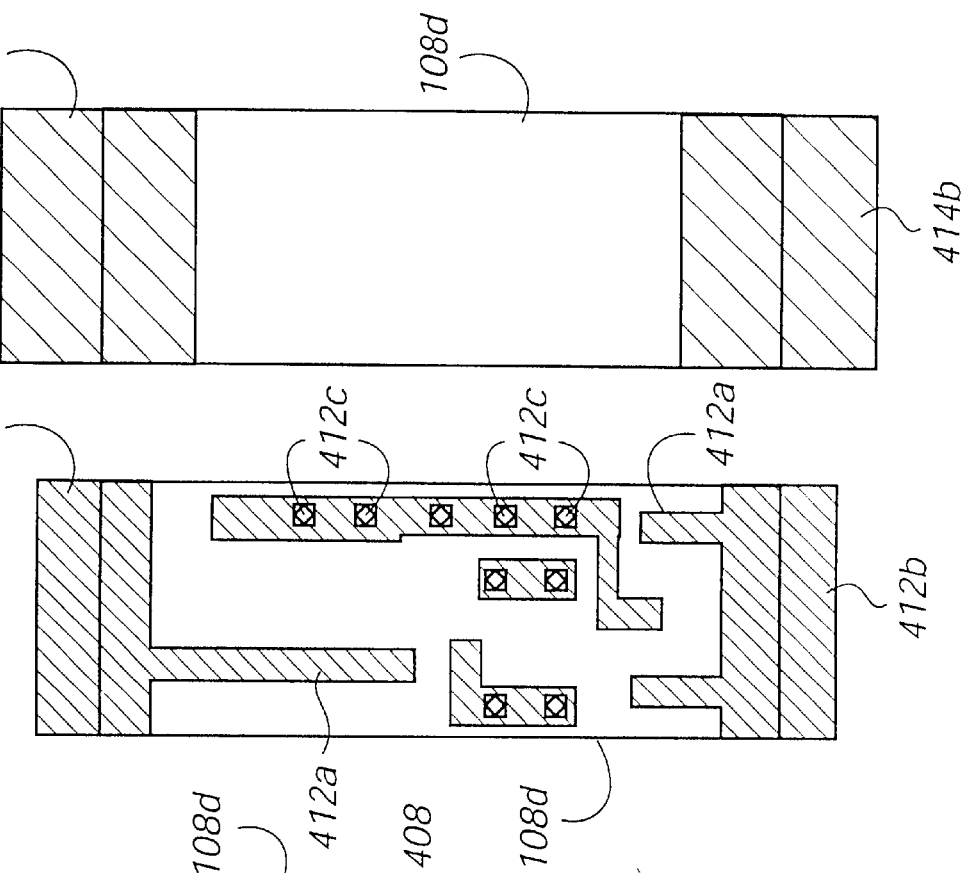
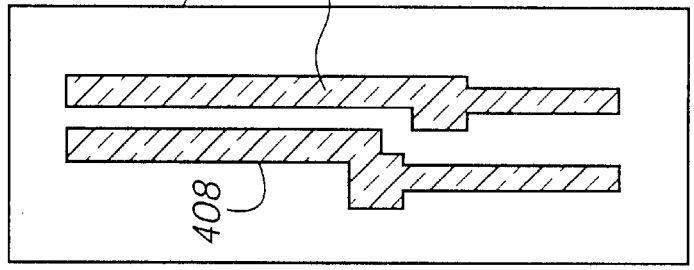
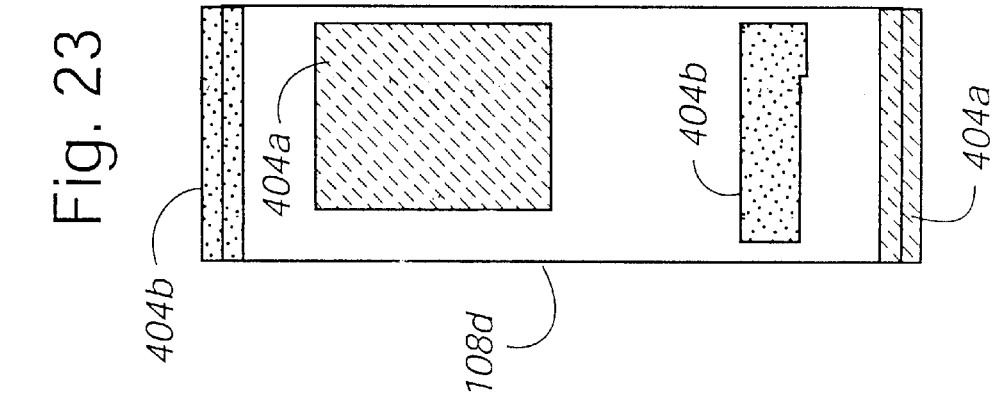

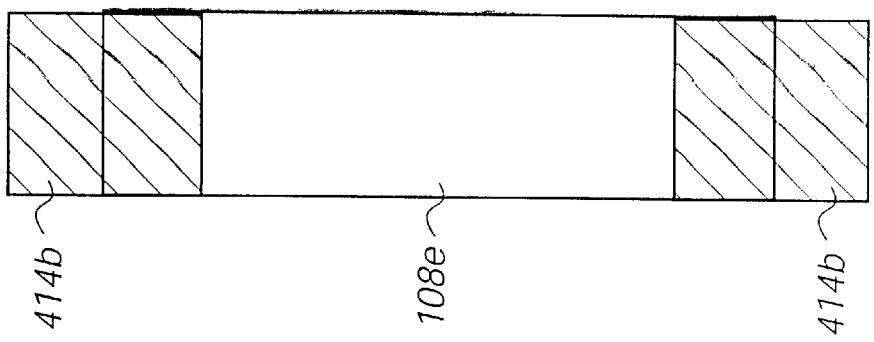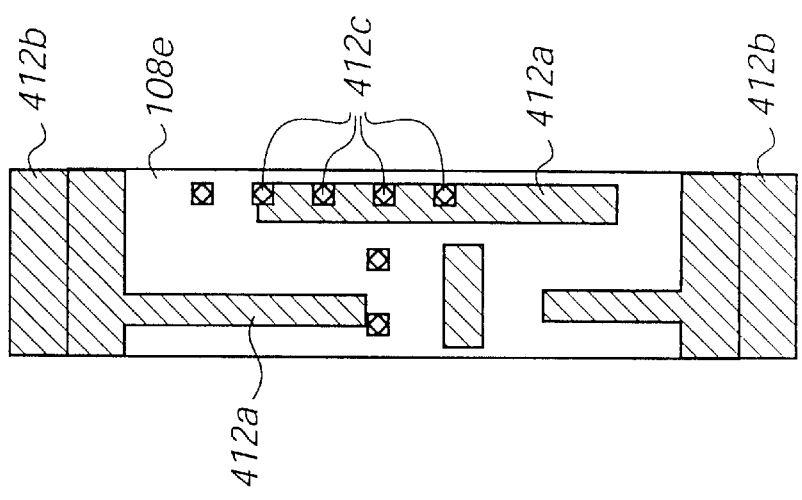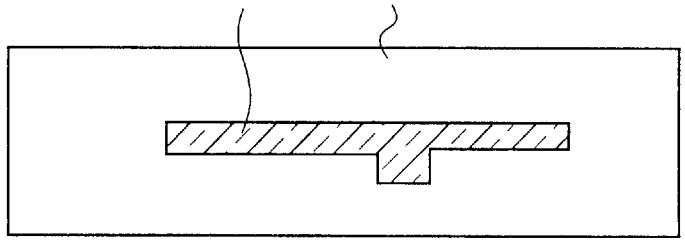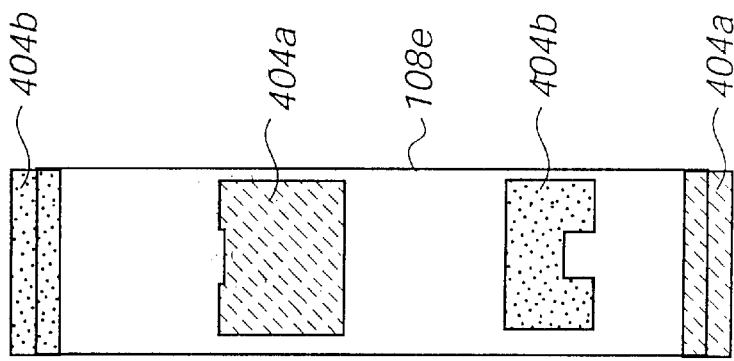

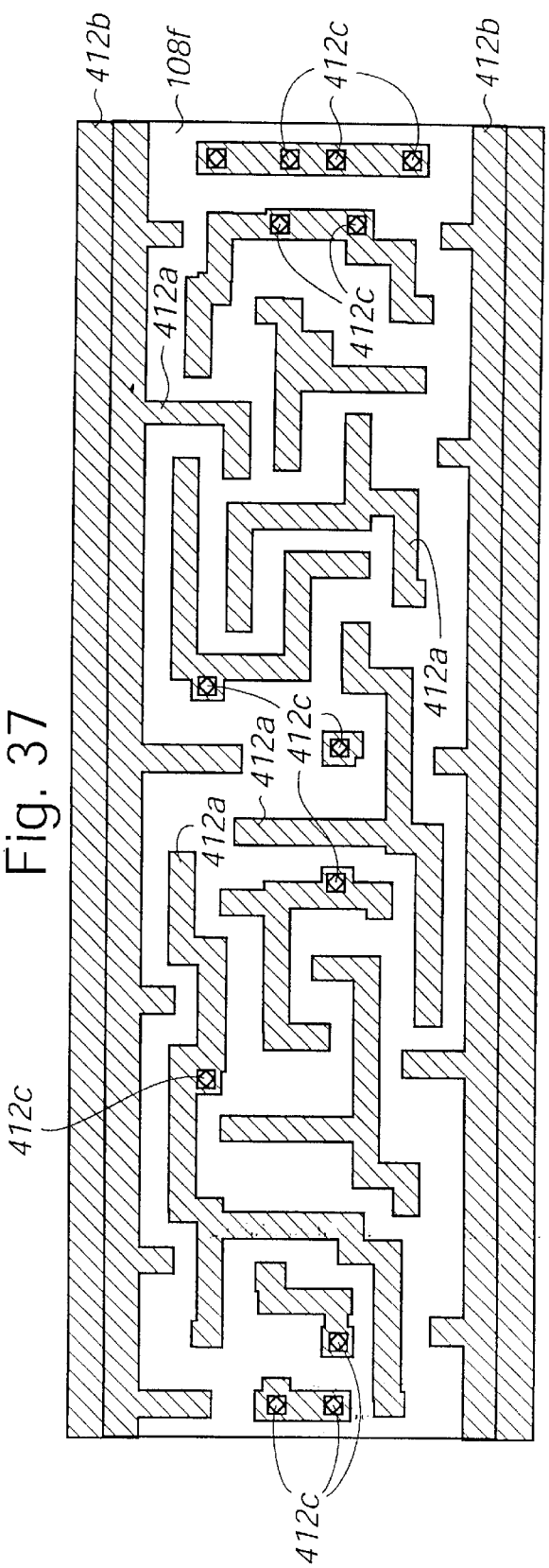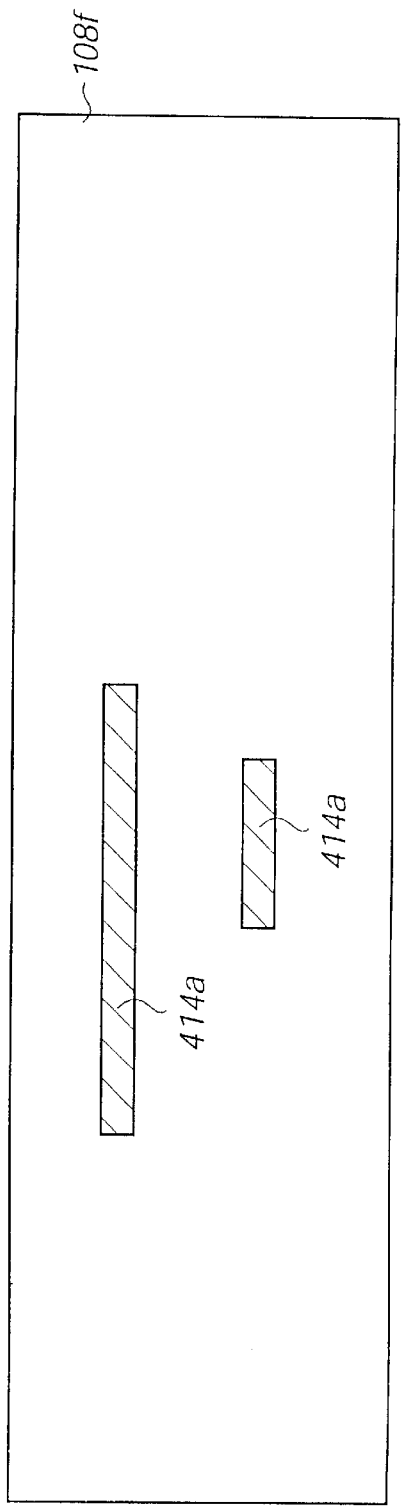

Fig. 47
Fig. 48
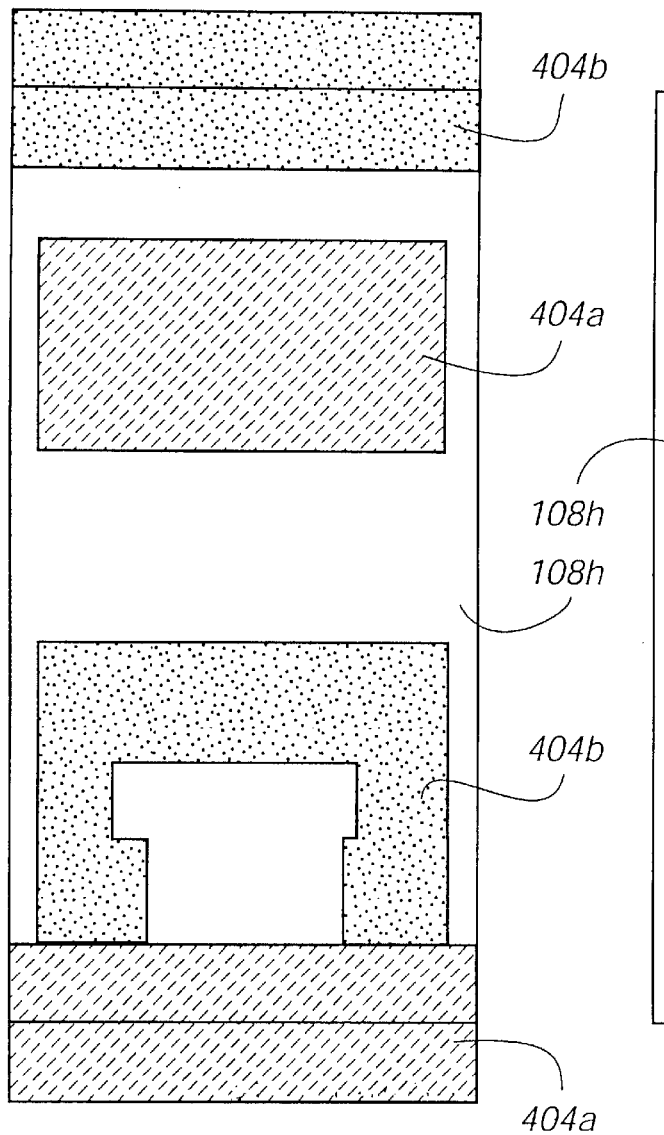
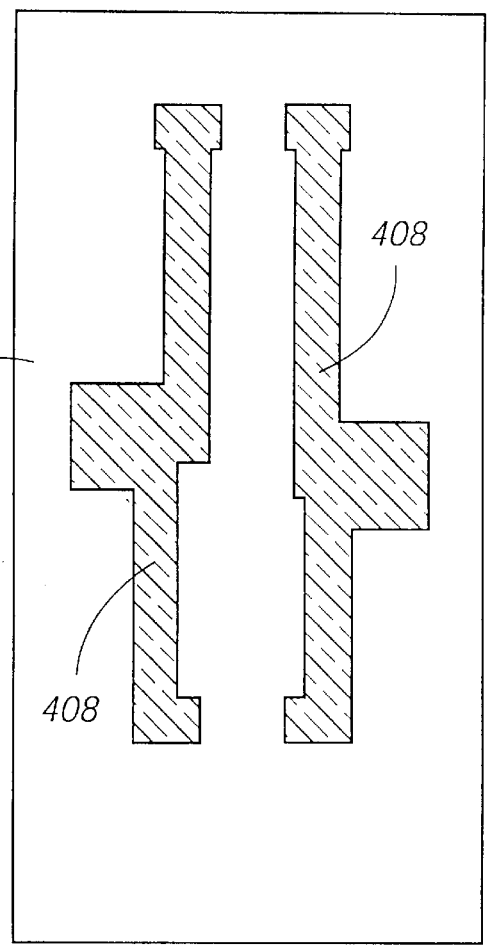

Fig. 49
Fig. 50
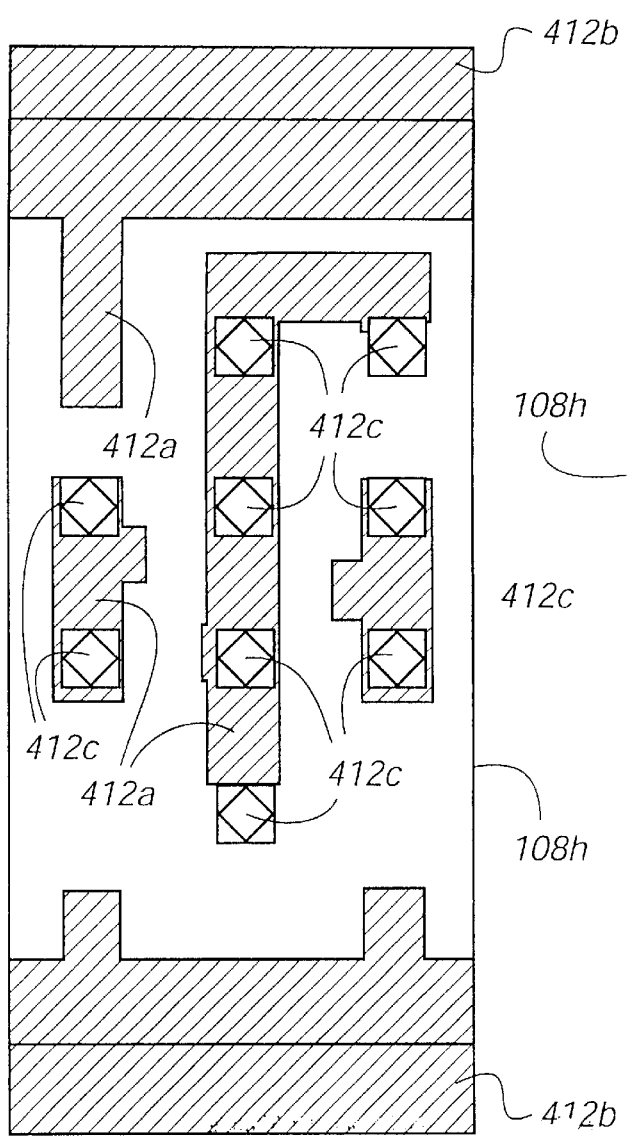
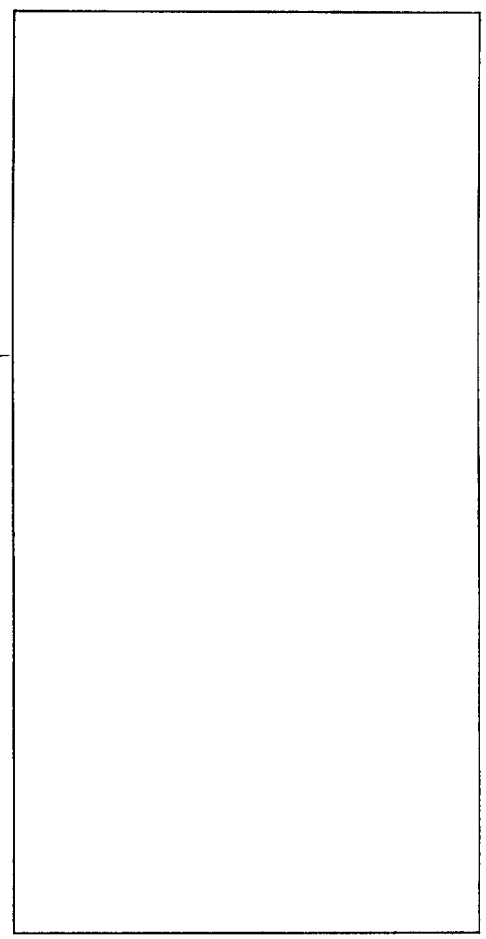

Fig. 53
Fig. 54
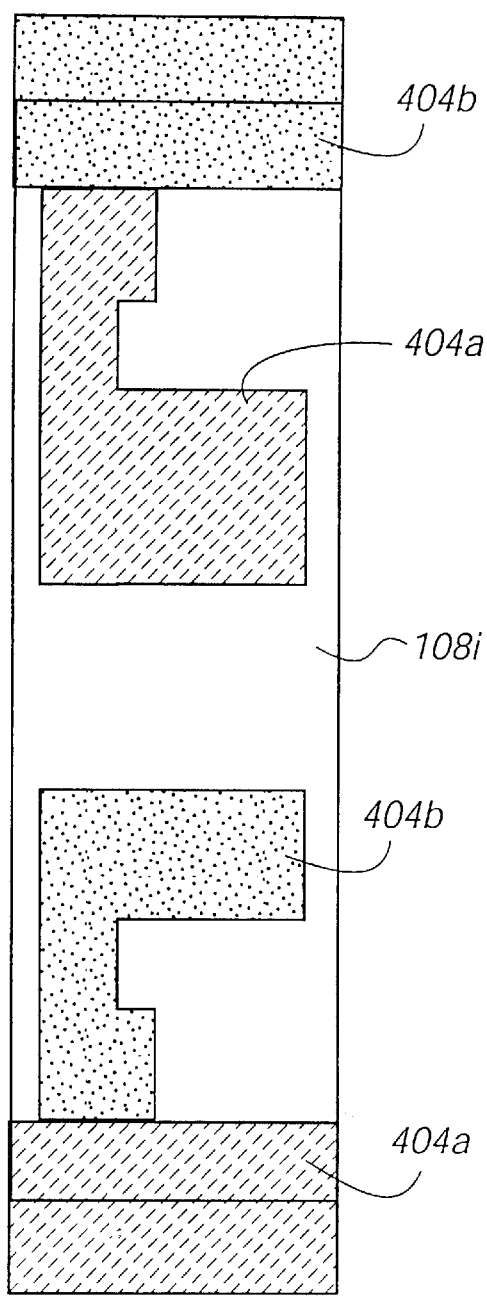
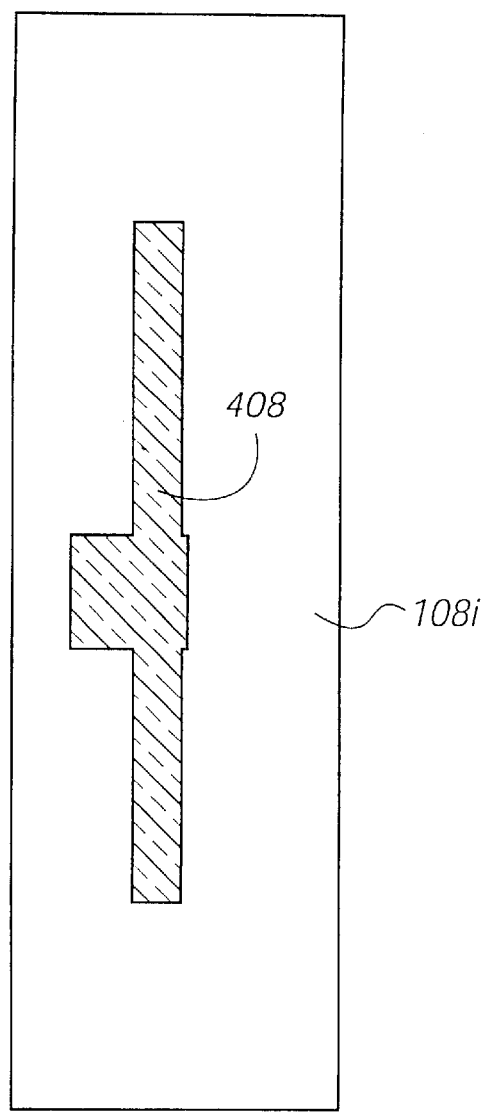

Fig. 55
Fig. 56
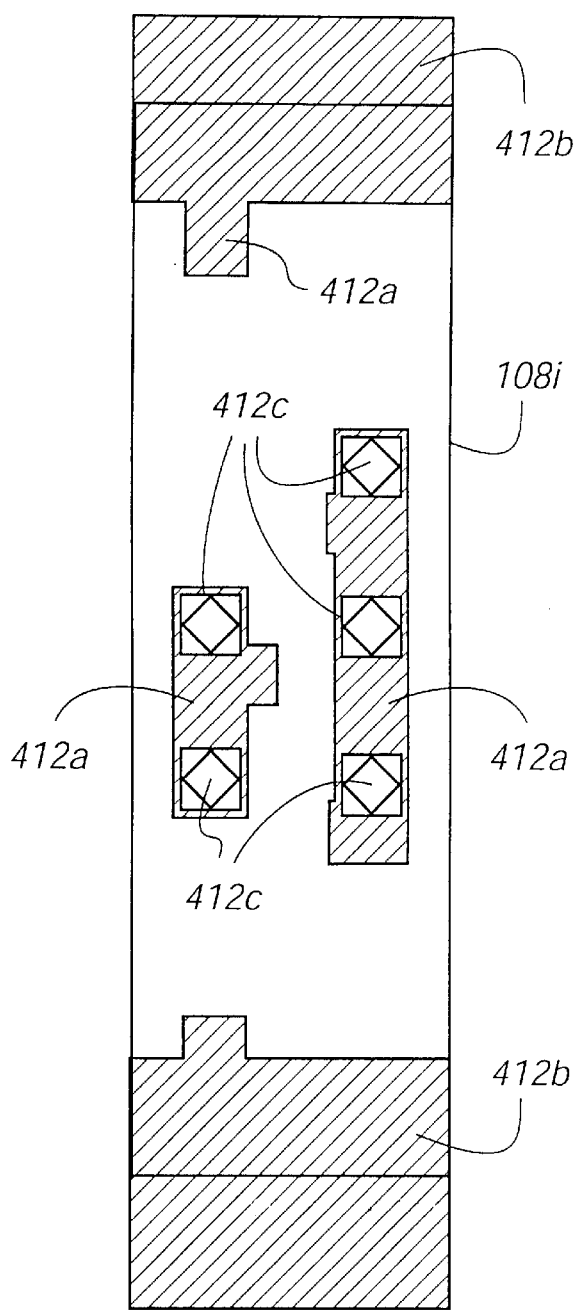
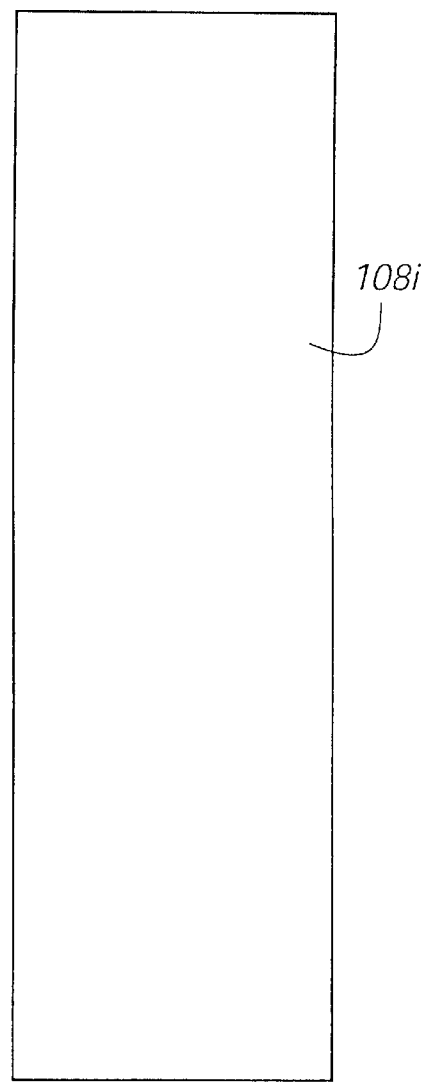

CELL ARCHITECTURE WITH LOCAL INTERCONNECT AND METHOD FOR MAKING SAME

BACKGROUND OF THE INVENTION

1. Field of the Invention

The present invention relates generally to integrated circuits, and more particularly to optimized layout design and fabrication techniques for making standard core cells used to design integrated circuit chips and application specific integrated circuit (ASIC) devices.

2. Description of the Related Art

As the demand for smaller and more efficient integrated circuit devices continues to grow, an even greater demand is placed on layout design engineers to develop new designs and processes. Because the complexity and density of integrated circuit designs have become quite complex, a common technique for designing integrated circuit designs is to use modeling software languages. The most popular and commonly used modeling software language is a hardware description language (HDL) named "Verilog" (IEEE Verilog Standard 1364, 1995). Using Verilog, designers are able to describe each component of an integrated circuit in terms of its functional behavior as well as its implementation. Once a circuit design using Verilog is complete, the Verilog code is synthesized to generate what is called a "netlist." A netlist is essentially a list of "nets," which specify components (know as "cells") and their interconnections which are designed to meet a circuit design's performance constraints.

However, the actual placement plan of components on silicon and the topography of wiring is reserved for a subsequent "layout" stage. In the layout stage, another software tool, commonly referred to as "place and route" software, is used to design the actual wiring that will ultimately interconnect the cells together. To do this, each cell typically has one or more "pins" for interconnection with pins of other cells. The "netlist" therefore defines the connectivity between pins of the various cells of an integrated circuit device.

Traditionally, the "place and route" software tools can either be used to design each and every one of a transistor's geometric layout interconnections (i.e., wiring) in order to fabricate the desired circuit, or alternatively implement some "pre-designed" layout cells. When pre-designed layout cells are used, the layout process is somewhat simplified because the bulk of the design work will only require laying out the geometric features that define the metallization interconnect lines and conductive vias of the various layers of a silicon chip. Although the use of pre-designed cells has been implemented for some time, the fabrication techniques and materials used to fabricate metallization interconnect lines has unfortunately remained stagnate.

For example, in the fabrication of semiconductor devices, various impurity implants and transistor isolation structures are first fabricated into the wafer. Next, the CMOS transistor structures, including their polysilicon gates, drains and sources are defined. Once the basic transistor structures are fabricated throughout the wafer, a dielectric layer is deposited over the transistor structures. At this point, conductive vias are formed in the dielectric layer before a first metallization layer (M-1) is blanket deposited. The first metallization layer is then patterned using standard photolithography techniques in order to define the desired geometric interconnections. This process is then repeated for as many subsequently layers as needed to complete the interconnections of the integrated circuit device. Although the place and route software is capable of generating a proposed wiring solution, the layout efficiency of the software tool is usually restricted by the complexity of the design and chip area constraints imposed by following rigid metallization wiring standards.

Traditionally, each metallization layer (M-1 through the highest metal layer) in a design is made from an aluminum-based material, which is known to have problems with electromigration. Although many techniques involving the addition of sophisticated barrier materials have been developed to combat the electromigration problem, the fabrication of additional barrier layers and materials does have the disadvantage of adding more complexity and cost to the fabrication of a given integrated circuit design.

In view of the foregoing, there is a need for new layout and fabrication techniques that simplify layout designs for complex integrated circuits. The is also a need for new standard cell designs that facilitate more dense designs and that implement materials that are more resistant to electromigration problems.

SUMMARY OF THE INVENTION

Broadly speaking, the present invention fills these needs by providing new standard cell designs that enable place and route software to design more complex and densely arranged circuits. The present invention also provides new standard cell designs that implement local interconnect materials to complete the lower level transistor interconnections to achieve a higher density design. It should be appreciated that the present invention can be implemented in numerous ways, including as a process, an apparatus, a system, a device, or a method. Several embodiments of the present invention are described below.

In one embodiment, a semiconductor standard cell architecture is disclosed. The standard cell architecture includes a semiconductor substrate having diffusion regions that are designated for source and drain regions of a functional circuit. The standard cell also includes a polysilicon layer that is patterned to define gate electrodes and interconnections of the semiconductor standard cell architecture. In addition, the standard cell includes a local interconnect metallization layer that is patterned into a plurality of local interconnect metallization lines that are configured to be disposed over the semiconductor substrate and are further configured to substantially interconnect the source and drain regions and gate electrodes to define the functional circuit. The plurality of local interconnect metallization lines are further designed to incorporate local interconnect metallization pins that are connection points for interconnecting the functional circuit to another functional circuit. In a preferred embodiment, the local interconnect metallization lines are configured to be fabricated from a high resistivity metal having a resistivity that is greater than aluminum containing metals/alloys.

In yet another embodiment, a semiconductor cell having a standard architecture is disclosed. The semiconductor cell is part of a library of cells that are accessible to a place and route layout tool that can be programmed to complete a semiconductor functional circuit on a semiconductor chip. The semiconductor cell includes a plurality of diffusion regions that designate source and drain regions of transistors of the semiconductor functional circuit. A polysilicon layout defining gate electrodes and interconnections of the semiconductor functional circuit. A local interconnect metallization layout that is patterned to define a plurality of local interconnect metallization lines that are configured to substantially interconnect selected ones of the source and drain regions and gate electrodes to at least partially define the semiconductor functional circuit. The local interconnect metallization layout is configured to be embodied in a material having a resistivity of at least about 0.1 ohms/square. In a most preferred embodiment, the material having the resistivity of at least 0.1 is tungsten.

In still another embodiment, a method for making a semiconductor cell having a standard architecture is disclosed. The semiconductor cell is designed to be part of a library of cells that are accessible to a place and route layout tool that uses the semiconductor cell to complete a semiconductor functional circuit that is to be fabricated on a semiconductor chip. The method includes: (a) defining a plurality of diffusion regions that designate source and drain regions of transistors of the semiconductor cell; (b) defining a polysilicon layout that identifies gate electrodes and interconnections of the semiconductor cell; and (c) defining a local interconnect metallization layout that is patterned to identify a plurality of local interconnect metallization lines that are configured to substantially interconnect selected ones of the source and drain regions and gate electrodes to at least partially define the semiconductor cell. The local interconnect metallization layout is preferably configured to be physically embodied in a material having a resistivity that is greater than that of aluminum. In another aspect of this embodiment, the method further includes designing local interconnect pins from the plurality of local interconnect metallization lines that enable an interconnection of the semiconductor cell to another semiconductor cell. In yet another aspect of this embodiment, the method includes designing local interconnect power buses from the plurality of local interconnect metallization lines.

Advantageously, the various embodiments of the present invention provide standard cell architectures that enable the fabrication of more compact cells, which are used in the design and fabrication of semiconductor chips. The strategic implementation of local interconnect metallization as the lowermost routing level also solves the prior art problems associated with aluminum electromigration. Additionally, the local interconnect metallization layout is designed to implement "pin" connections, which are used by suitable place and route software tools. The local interconnect metallization is also capable of being implemented for local power buses "Vss" and "Vdd". Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 2 shows an example of a local interconnect cell library having a number of exemplary local interconnect standard cells (SC), which may be used by the standard place and route software in order to wire a desired integrated circuit design.

FIGS. 11 through 16 illustrate selected layers of a NAND2 gate standard cell implementing local interconnect metallization in accordance with one embodiment of the present invention.

FIGS. 17 through 22 illustrate layers of another exemplary D-flip flop standard cell in accordance with one embodiment of the present invention.

FIGS. 23 through 28 illustrate specific layers of a NOR2 gate standard cell in accordance with one embodiment of the present invention.

FIGS. 29 through 34 illustrate selected layers of an inverter gate standard cell in accordance with one embodiment of the present invention.

FIGS. 35 through 40 illustrate a D-flip flop standard cell which does not utilize a metal-1 power bus in accordance with one embodiment of the present invention.

FIGS. 47 through 52 illustrate layers of a NOR2 standard cell in accordance with one embodiment of the present invention.

FIGS. 53 through 58 illustrate the various layers of an inverter standard cell in accordance with one embodiment of the present invention.

DETAILED DESCRIPTION OF THE PREFERRED EMBODIMENTS

An invention for standard cell designs that enable "place and route" software to design more complex and densely arranged circuits is disclosed. The present invention also provides new standard cell designs that implement local interconnect metallization materials to complete the lower level transistor interconnections. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
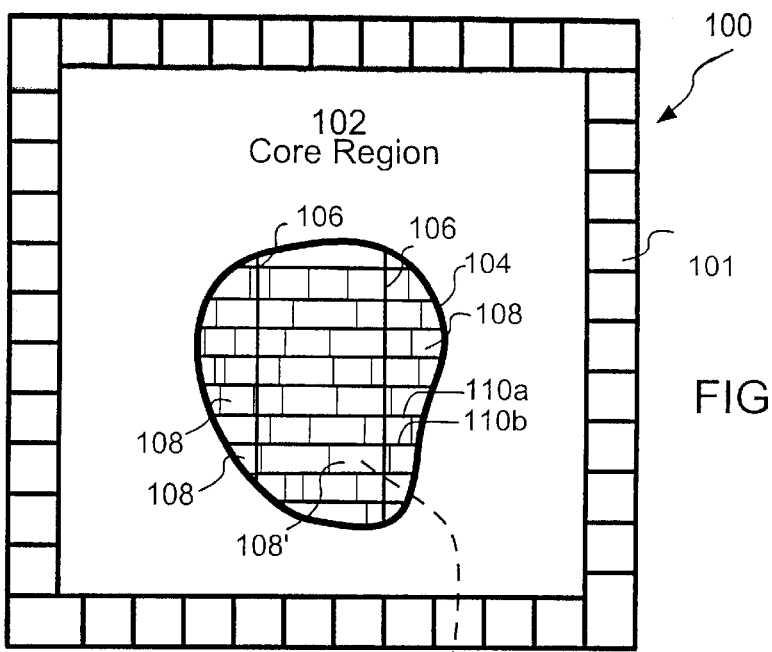
FIG. 1A shows a semiconductor chip having a core region and input/output (I/O) regions around the periphery of the semiconductor chip.

FIG. 1A shows a semiconductor chip 100 having input/output (I/O) regions 101 around the periphery of the semiconductor chip. As shown, the semiconductor chip 100 has a core region 102 where the integrated circuit design is electrically and functionally designed using a multitude of standard cells 108 that are interconnected and strategically placed using a "place and route" software tool that implements a generated netlist for the integrated circuit design being made. As shown, in a magnification view 104, each of the standard cells 108 are commonly arranged between a $V_{DD}$ power bus 110a and a $V_{SS}$ power bus 110b.

Figure 1B:
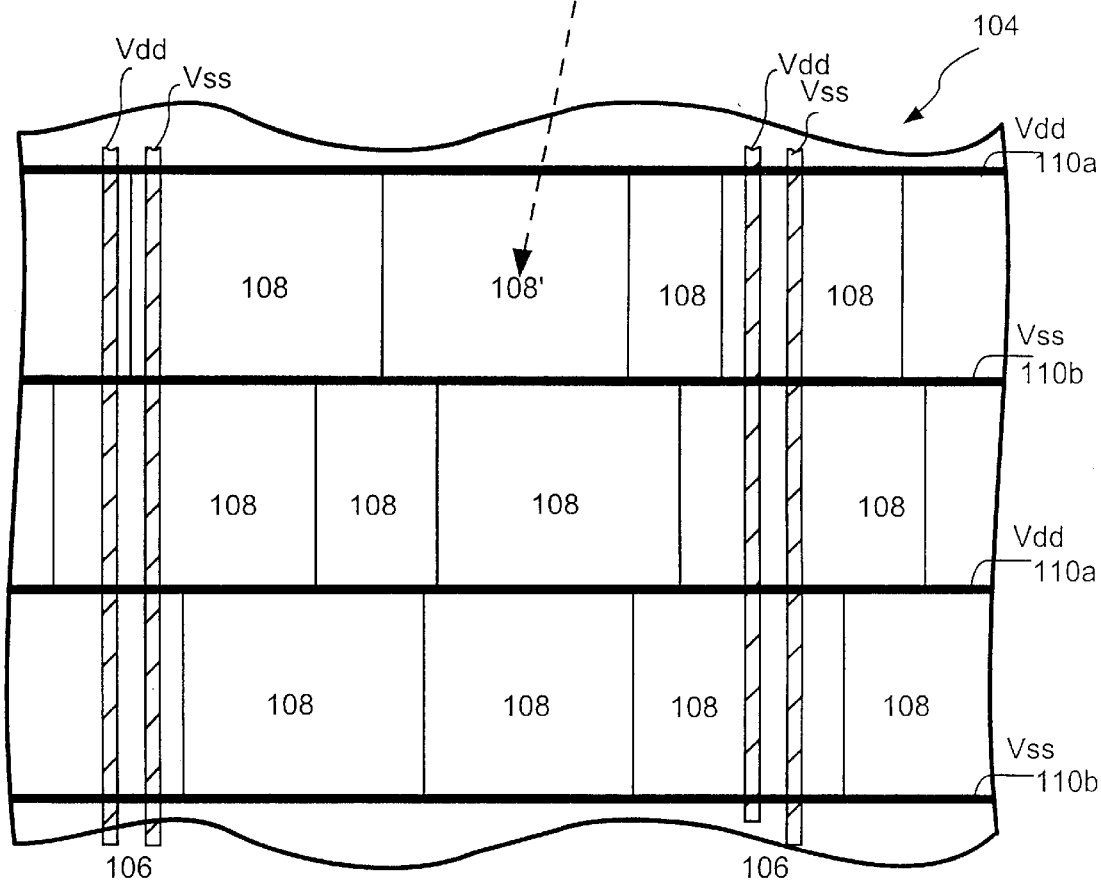
FIG. 1B shows a magnified view of cells in the core region of the semiconductor chip of FIG. 1A.

For simplicity, reference is now drawn to FIG. 1B where the magnified view of cells 104 illustrates how each standard cell 108 may be positioned between the power buses 110. In addition, vertical power buses 106 are arranged having predefined separations (i.e., a horizontal distance between the power buses 106) throughout the core region in order to better distribute current throughout the cells of the integrated circuit chip 100. The vertical power buses 106 are also referred to as "power straps," which are shown interconnected to selected horizontal power buses 110. As will be illustrated in greater detail in FIGS. 4A through 5B, the standard cells 108 of the present invention are unique cells that implement a local interconnect metallization for a lowermost interconnection layer. This should be contrasted with conventional cells that implement aluminum metallization for all interconnect lines of the cell. As mentioned above, the use of aluminum metallization, especially in the lowermost interconnect levels can, in some cases, result in serious electromigration problems.

FIG. 2 shows an example of a local interconnect cell library 200 having a number of exemplary local interconnect standard cells (SC) 108, which may be used by a standard place and route software tool in order to wire a desired integrated circuit design. In this example, the local interconnect cells 108 of the local interconnect cell library 200 include D flip-flop cells, NAND gate cells, NOR gate cells, and inverter cells. Of course, these cells are merely exemplary and are used herein to illustrate the modularity of implementing local interconnect technology in the design of standard cell libraries.

As mentioned above, in accordance with the present invention, each of the standard cells will preferably implement a lowermost local interconnect metallization material that is substantially more resistive than aluminum based materials. As discussed herein, the local interconnect metallization will be referred to as the "M-0" metal layer. The more resistive material is therefore a heavier metal than aluminum. Although the heavier metal can be any metal that is capable of being formed into semiconductor interconnect lines, exemplary materials may include a tungsten "W"material, a tin-alloy material, and any other material that exhibits the material characteristics of having a higher resistance than that aluminum based materials.

For the exemplary tungsten material, the resistivity is typically between about five to ten times more than aluminum metallization materials. Because of this increase of resistance, the lowermost local interconnect lines must be designed such that a particular line resistance is less than about 100 Ohms to minimize the impact on performance. As an example, if a metallization line is designed to be about 1 micron wide, and the tungsten resistivity is about 0.4 ohms/square, then the local interconnect metallization line cannot be more than about 250 microns in length. However, for most standard local interconnect cells 108 of the present invention, such a limitation in length is generally not so limiting as to impact the design requirements.

Figure 3A:
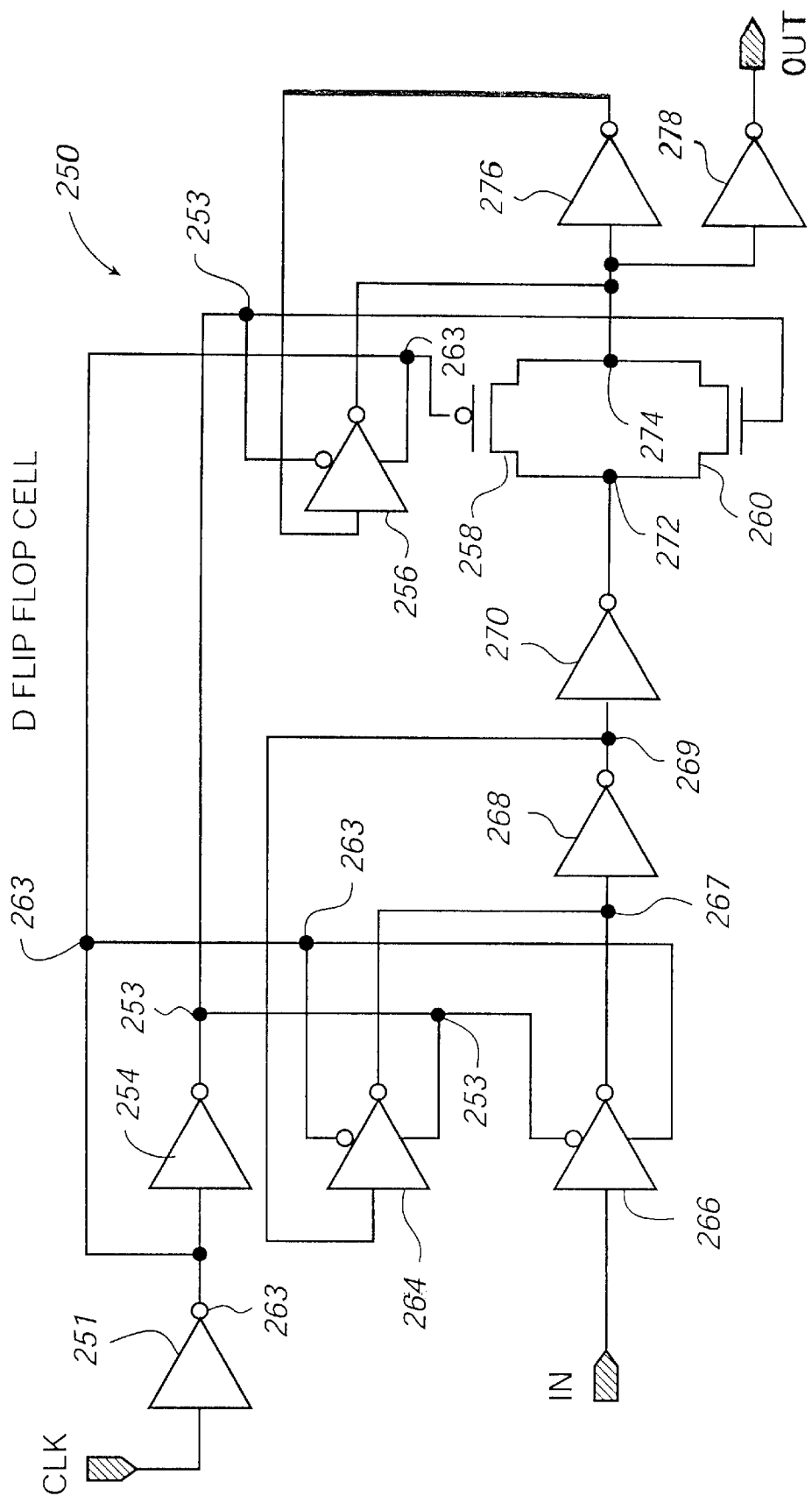
FIGS. 3A through 3D illustrate a number of exemplary circuit diagrams that are representative of some of the local interconnect standard cells of the present invention.

FIGS. 3A through 3D illustrate a number of exemplary circuit diagrams that are representative of some of the local interconnect standard cells 108 of the present invention. For completeness, a general description of the some standard circuits that can be embodied in cells of the present invention will be described. Accordingly, FIG. 3A illustrates a D flip-flop cell 250 having a clock (CLK) input, an (IN) node, and an (OUT) node. The IN node is connected to a tri-state inverter 266 which has an output connected to a node 267. The N-type transistor of the tri-state inverter 266 is connected to a node 263, and the P-type transistor of the tri-state inverter 266 is connected to a node 253. Node 267 is connected to the input of an inverter 268 which has an output connected to a node 269. Node 269 in turn is connected to an input of a tri-state inverter 264.

The output of tri-state inverter 264 is connected to node 267. The N-type transistor of tri-state inverter 264 is connected to node 253 and the P-type transistor of the tri-state inverter 264 is connected to a node 263. The clock input is connected to an input of an inverter 251 which has an output that is connected to a node 263. Node 263 is in turn connected as an input to inverter 254 which has an output connected to node 253. Inverter 270 has an input as a node 269 and an output that is connected to a node 272 which is connected between terminals of transistors 258 and 260. Transistor 260 has its gate connected to node 253, and transistor 258 has its gate connected to node 263. A node 274 is connected between the terminals of transistors 258 and 260 which forms an input to an inverter 276 which has an output that is connected to a tri-state inverter 256. Node 274 also forms the input of an inverter 278 which has an output connected to the out terminal. Tri-state inverter 256 has its P-type transistor connected to node 253, and its N-type transistor connected to node 263 which also forms the gate of transistor 258.

Figure 3B:
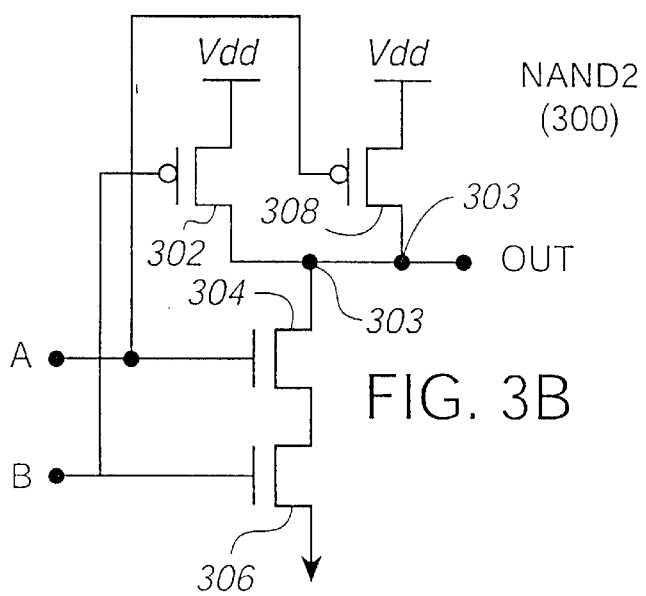

FIG. 3B illustrates a two-input NAND gate 300. The input terminals of NAND gate 300 are illustrated as inputs A and B. Input A forms the connection to a gate of transistor 304 and a gate of transistor 308. Input B forms the connection to the gate of transistors 302 and 306. Transistors 302, 304, and 308 are each connected to a node 303 which defines the output of the NAND gate 300.

Figure 3C:
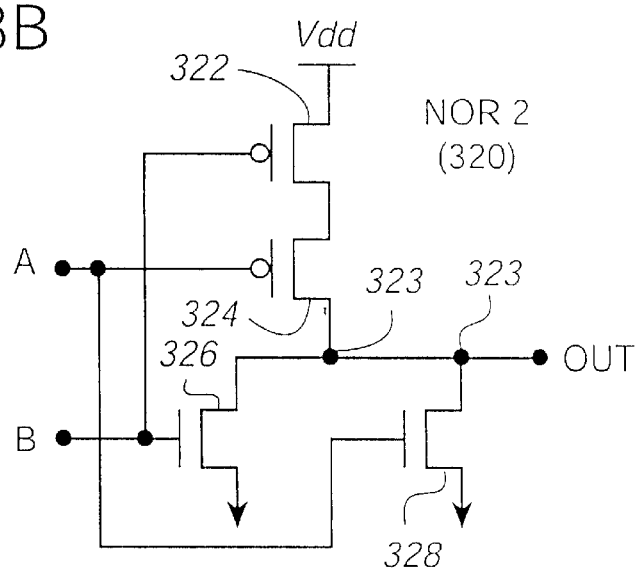

FIG. 3C illustrates a NOR gate 320 having input terminals A and B. Terminal A is connected to the gates of transistors 324 and 328, while terminal B is connected to the gates of transistors 322 and 326. A terminal of transistors 324, 326, and 328 are each connected to a node 323, which forms the output of the NOR gate 320.

Figure 3D:
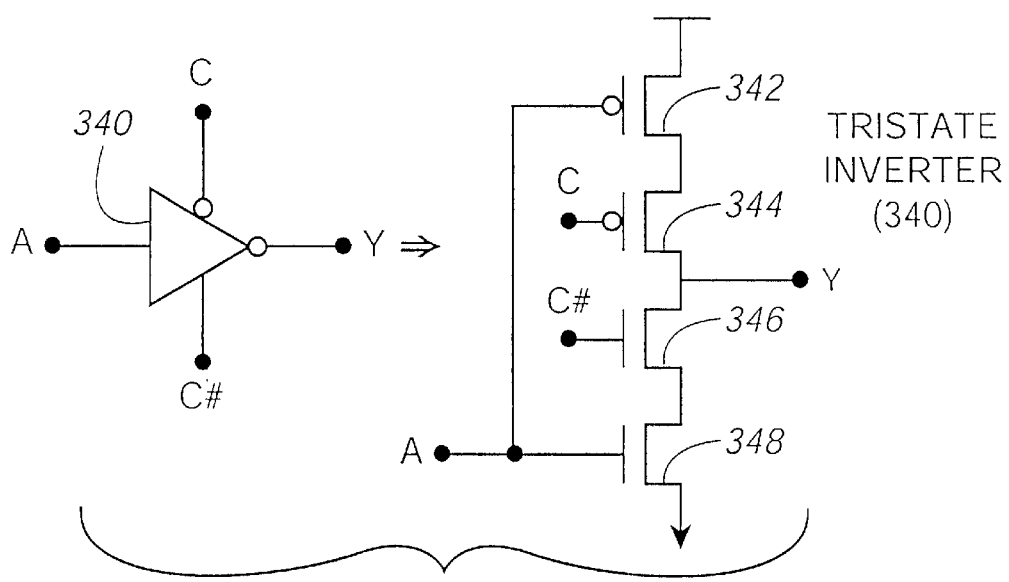

FIG. 3D illustrates a tri-state inverter 340 having inputs A, C, C#, and an output Y. A transistor level diagram is also provided of the tri-state inverter 340 having its respective inputs coupled to transistors 342, 344, 346, and 348. The output Y is connected between terminals of transistors 344 and 346.

Figure 4A:
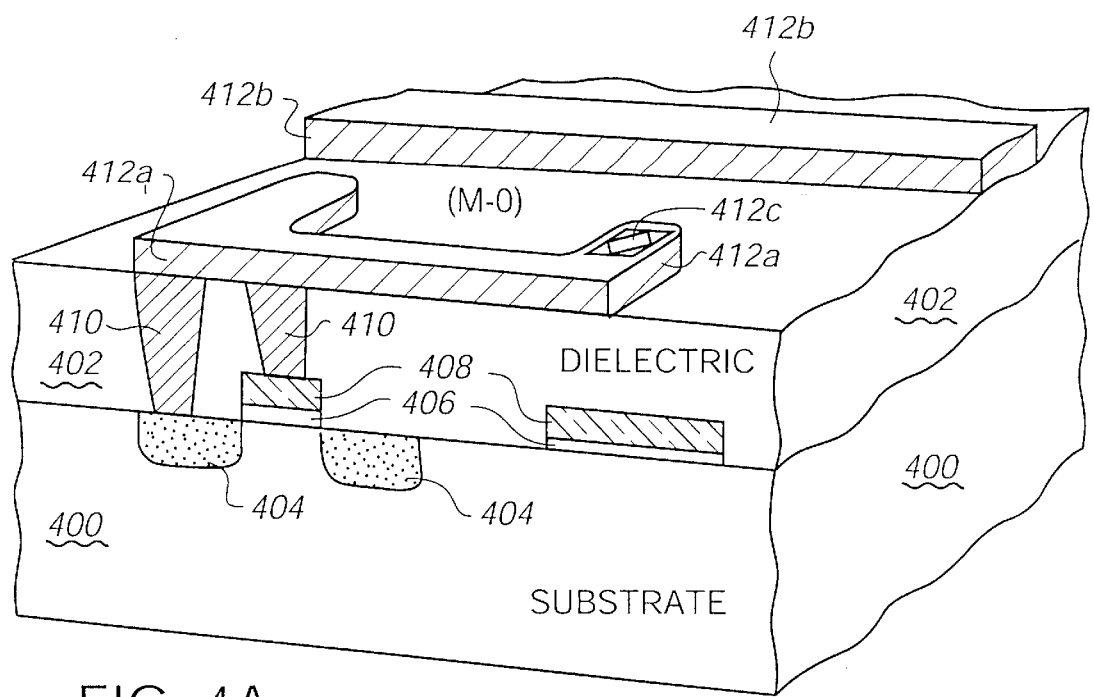
FIGS. 4A–4B illustrate cross-sectional views of a semiconductor substrate having fabricated integrated circuit device layers in accordance with one embodiment of the present invention.

FIG. 4A illustrates a cross-sectional view of a semiconductor substrate 400 having fabricated integrated circuit device layers in accordance with one embodiment of the present invention. As shown, the semiconductor substrate 400 has exemplary diffusion regions 404, which define the source and drain regions for the illustrated simplified semiconductor transistor device. In this simplified diagram, the transistor device has a gate oxide 406 and a polysilicon gate line 408. Throughout the semiconductor substrate 400, other transistor devices and partial routing may be completed using the polysilicon line 408 and associated gate oxide 406.

Once the polysilicon lines 408 have been formed, a dielectric layer 402 is deposited over the transistor devices. At that point, conductive vias 410 are formed throughout the dielectric layer 402 in order to make an electrical connection down to the transistor devices, which electrical connection is made once a subsequent metallization layer is formed. In this embodiment, the conductive vias 410 are shown interconnecting a diffusion region 404 and a polysilicon gate 408 to a local interconnect metallization line 412a. As discussed above, the local interconnect metallization lines (M-0) are formed of more resistive metallization materials such as tungsten (W).

Also shown in FIG. 4A, is an integral local interconnect pin connection 412c which is used by the place and route software in order to interconnect the logic circuitry of each of the local interconnect cells with one another in accordance with a pre-generated netlist. The local interconnect metallization (M-0) is also preferably used to form local interconnect power buses 412b in an integrated circuit design. Specifically, local interconnect power bus 412b is analogous to one of the power buses 110a or 110b as shown in FIG. 1B. It should be appreciated that in this embodiment of the present invention, the local interconnect metallization lines 412a, the local interconnect pin connections 412c, and the local interconnect power buses 412b are all formed from the same heavier metallization material, such as tungsten.

As already mentioned above, although the resistance of materials such as tungsten are substantially higher than that of aluminum metallization, such higher resistance does not necessarily reduce the speed at which the device functions when local interconnect lines are limited to lengths that yield resistances that are less than about 100 Ohms. When the local interconnect power buses 412b are implemented in accordance with this embodiment, the metal-1 power buses 106 (i.e., power bus strapping, which can be designed to be on any metal level including M-1 and above) of FIG. 1B are preferably arranged slightly closer together than when aluminum metallization is used for the power buses 412b. In one embodiment of the present invention, the separation of the power buses 106 of FIG. 1B are preferably set to be between about 100 microns and about 5,000 microns for a 0.25 micron technology device. In this manner, the power buses 412b (which are analogous to power buses 110 of FIG. 1B), will be capable of carrying higher amounts of current even with the higher resistivity of the interconnect metallization.

Figure 4B:
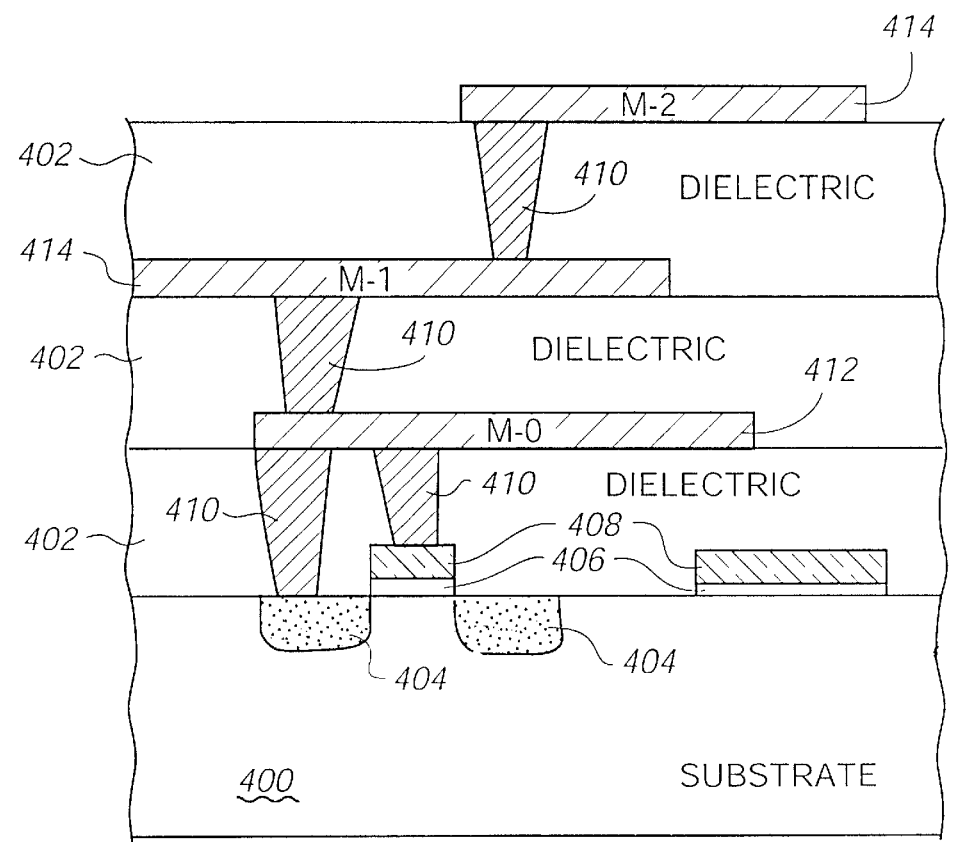

Once the interconnect metallization 412 has been formed, additional aluminum metallization interconnect layers may be formed in accordance with the design configured by the place and route layout tool. As shown in FIG. 4B, a dielectric layer 402 is deposited in between the local interconnect metallization (M-0) 412 and the next aluminum metallization (M-1) 414. If additional metallization layers are required to complete the interconnections of the transistor devices, additional metallization layers 414, such as M-2, M-3, M-4, M-5, etc., can be formed.

In sum, by using the interconnect metallization 412 (M-0) to complete the lowermost level of interconnections for a standard cell, a more dense integrated circuit design may be formed. In addition, a greater density is also achieved because the local interconnect metallization is also capable of being used for power buses, and as pin interconnections for the place and route software. Additionally, when a standard cell leaves a sufficient amount of free space for additional routing in M-0 over a standard cell, the place and route software can also take advantage of that free space in order to achieve a higher density for a given integrated circuit chip.

Further yet, because most of the critical interconnections are completed using the local interconnect metallization lines, the place and route software is allotted with more resources to complete the routing throughout the integrated circuit device with the remaining metal layers M-1 through M-n. Advantageously, fewer aluminum metallization layers may be needed to complete the design. In some cases, the first layer of aluminum metallization lines (M-1), may also be used to perform "metal strapping" in either the vertical or the horizontal direction of a standard cell design (as illustrated below in FIGS. 8, 20 and 38). This also enables the design of smaller height cells. Accordingly, even very complex standard cell designs will end up requiring fewer metallization lines in order to complete the interconnections for the given circuit being built.

Figure 5:
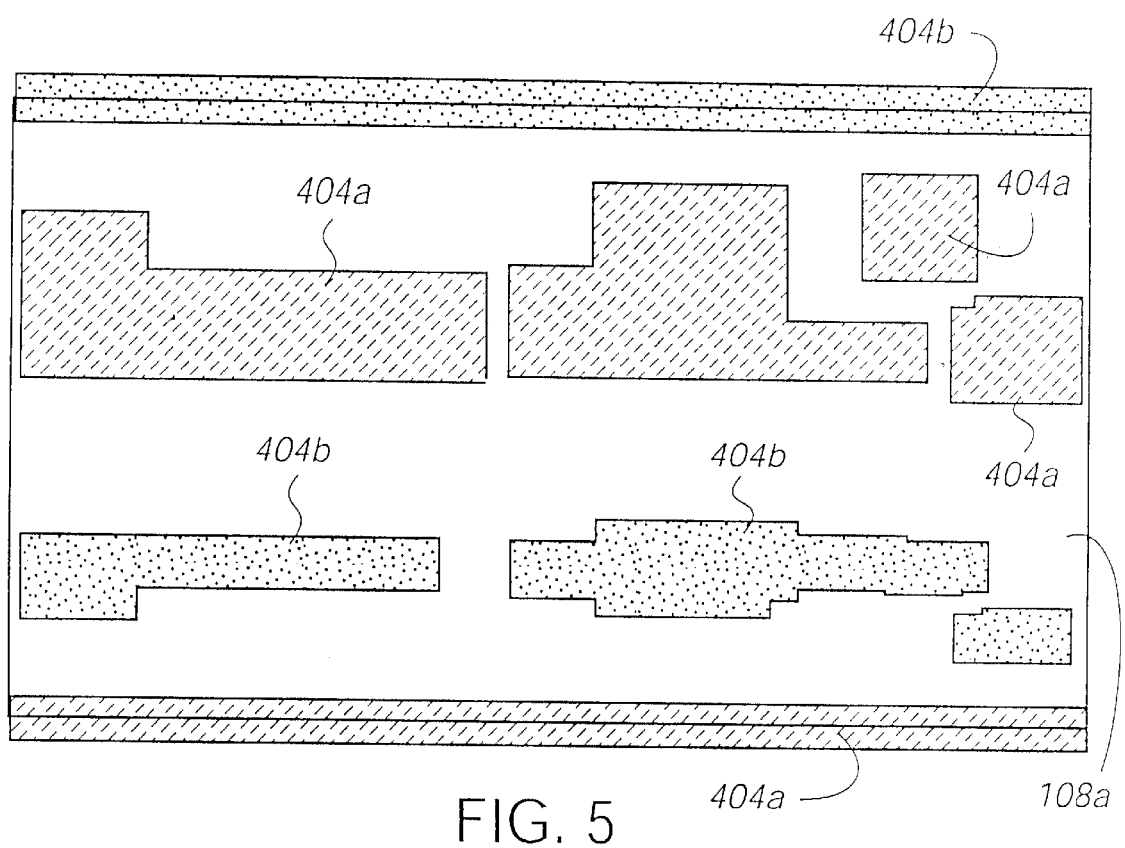
FIGS. 5 through 10 illustrate selective layers of a D-flip flop standard cell that implement local interconnect wiring in accordance with one embodiment of the present invention.
Figure 58:
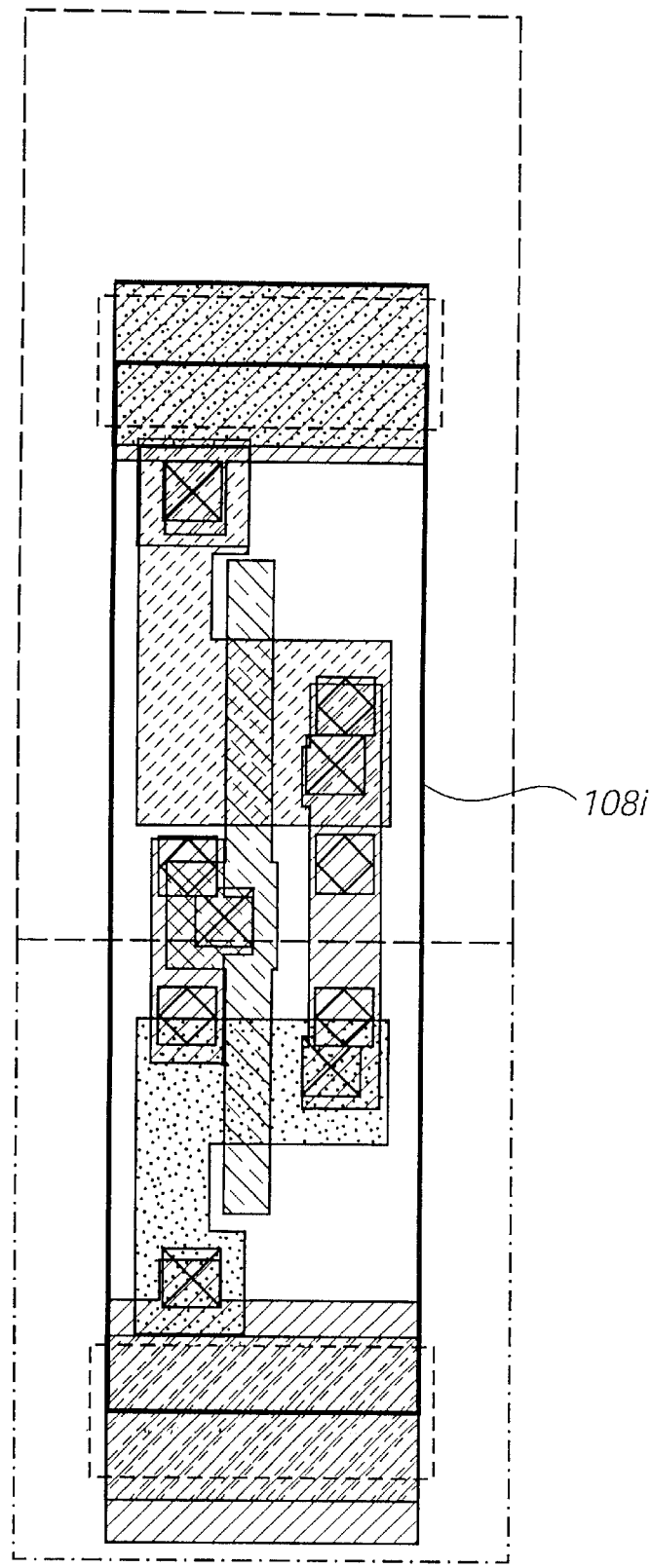

FIGS. 5 through 58 will illustrate standard cell designs which implement local interconnect wiring to complete the majority of the transistor interconnections for a given type of integrated circuit cell. For ease of illustration, each exemplary standard cell will be shown one layer at a time in order to avoid unnecessarily complicating the illustration of the particular standard cell.

Accordingly, FIGS. 5 through 9 will illustrate selective layers of a D-flip flop standard cell that implements local interconnect wiring in accordance with one embodiment of the present invention. As shown in FIG. 5, the D-flip flop standard cell 108a includes N-type diffusion regions 404b, and P-type diffusion regions 404a in the internal region of the cell, which are used to implement the transistor source and drain regions.

Figure 6:
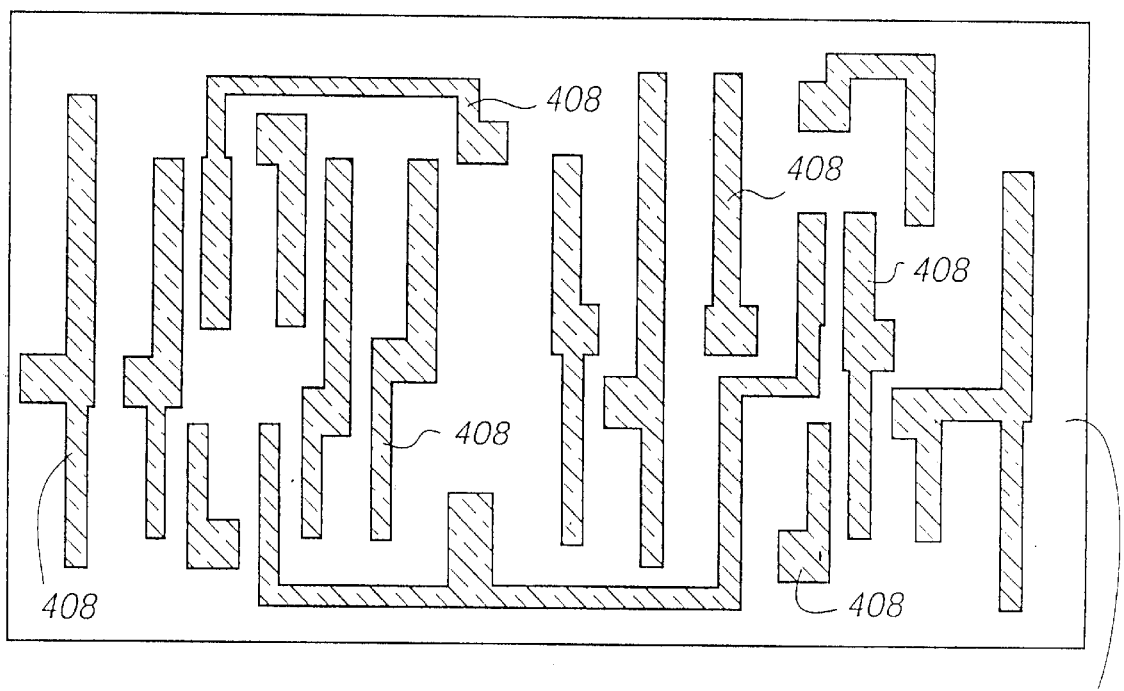
Figure 7:
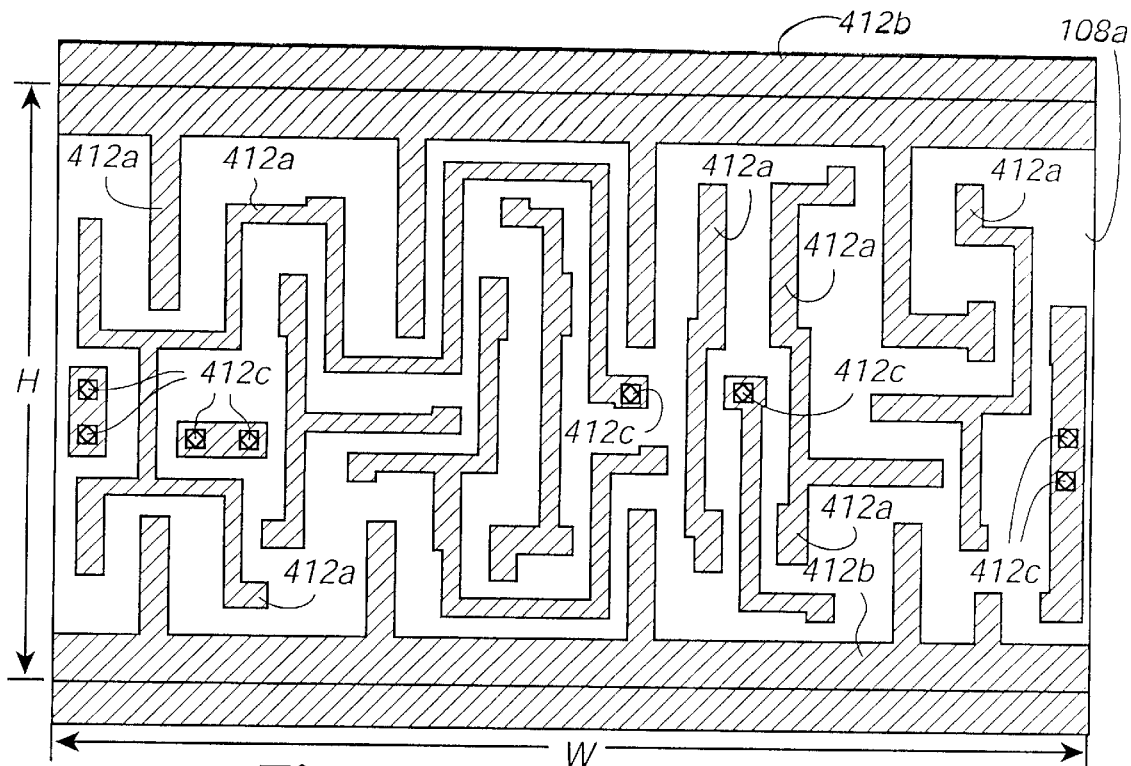

Additionally, the D-flip flop standard cell 108a includes N-type diffusion regions 404b and P-type diffusion regions 404a, which act as substrate diffusions at cell border regions where the power buses $V_{DD}$ and $V_{SS}$ 110 will overlie. FIG. 6 illustrates the geometric patterns of a polysilicon layer 408 which is used to define transistor polysilicon gates and some of the interconnections. In FIG. 7, an illustration of the local interconnect metallization lines 412a, the local interconnect metallization pins 412c, and the local interconnect power buses 412b are provided in accordance with one embodiment of the present invention. As can be appreciated, these local interconnect metallization lines 412 define substantially all of the critical transistor interconnections that are required for defining the D-flip flop standard cell 108a. In this example, the D-flip flop standard cell 108a preferably has a width W that is about 18.05 microns, and a cell height that is about 10.45 microns.

Using these exemplary dimensions, it is apparent that none of the local interconnect metallization lines 412a are so long that the higher resistance of the metallization material will impact the performance of the integrated circuit device. Although the local interconnect power buses 412b are generally continuous (i.e., connected cell-to-cell) when the cells are aligned in rows in an integrated circuit chip, the metal-1 power bus strappings 106 (e.g., 106 of FIG. 1D), will function to enlarge the current-carrying capabilities of the higher resistance local interconnect material.

Figure 8:
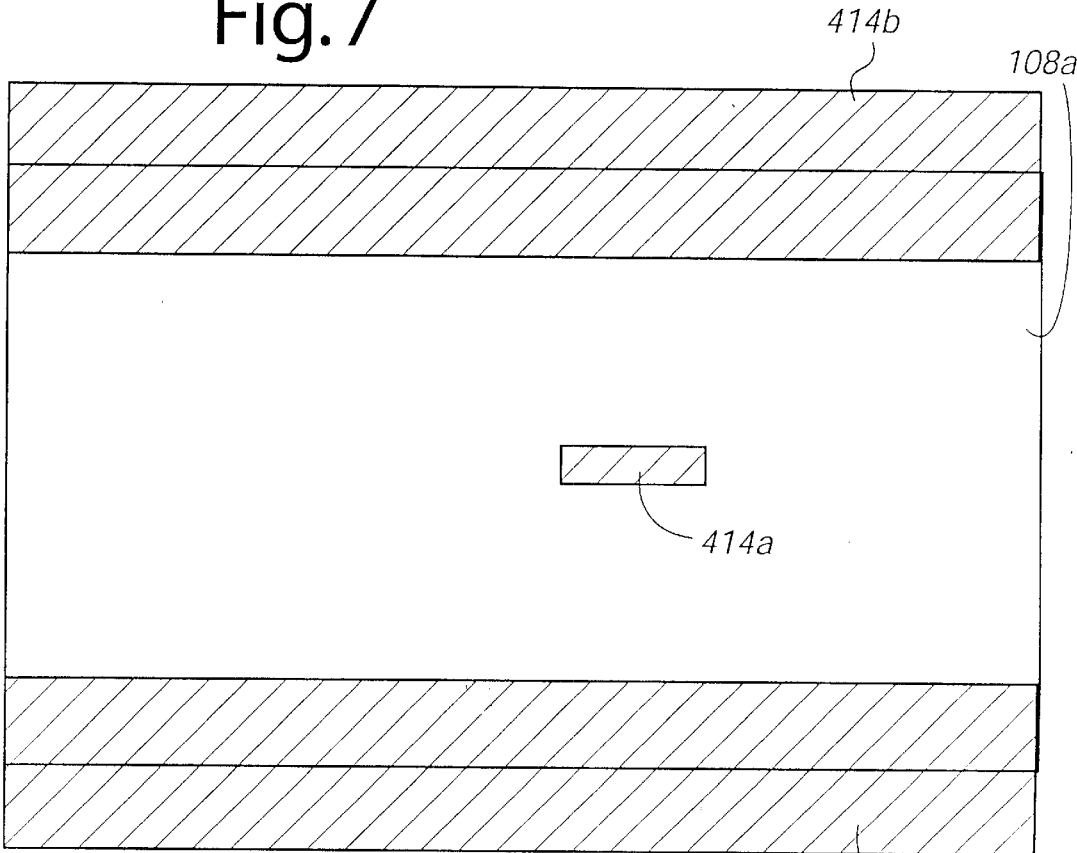

FIG. 8 illustrates a first metallization layer (M-1) 414a, that is used to complete the interconnections of the D-flip flop standard cell 108a. In this embodiment, a single horizontal metal strapping 414a is used to complete the basic interconnections of the D-flip flop circuit of the standard cell 108a. As an optional feature, the standard cell can also include metal-1 power buses 414b which are designed to be interconnected with the local interconnect power buses 412b when higher resistances are considered to be a problem for an integrated circuit design.

Figure 9:
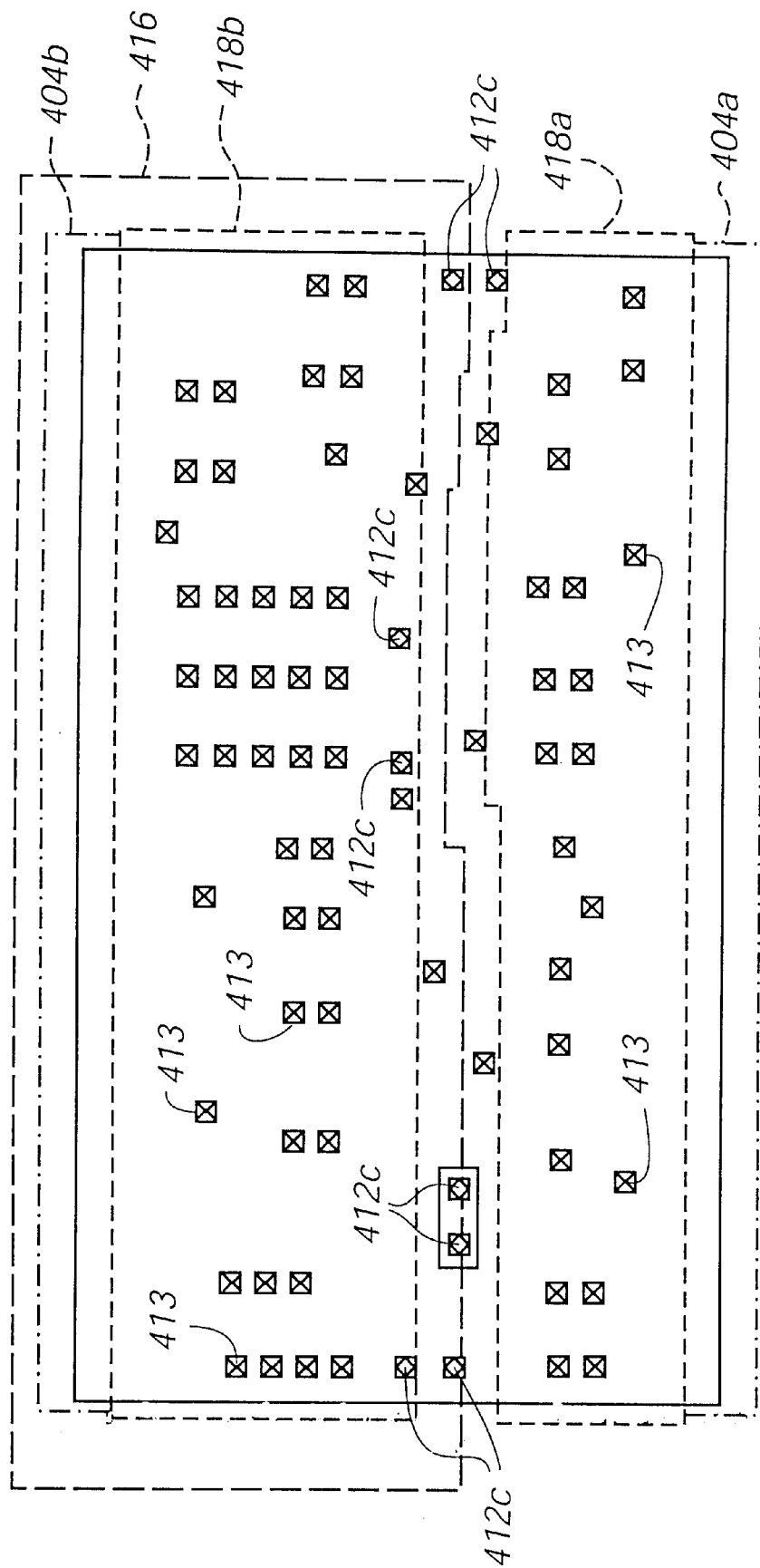
Figure 10:
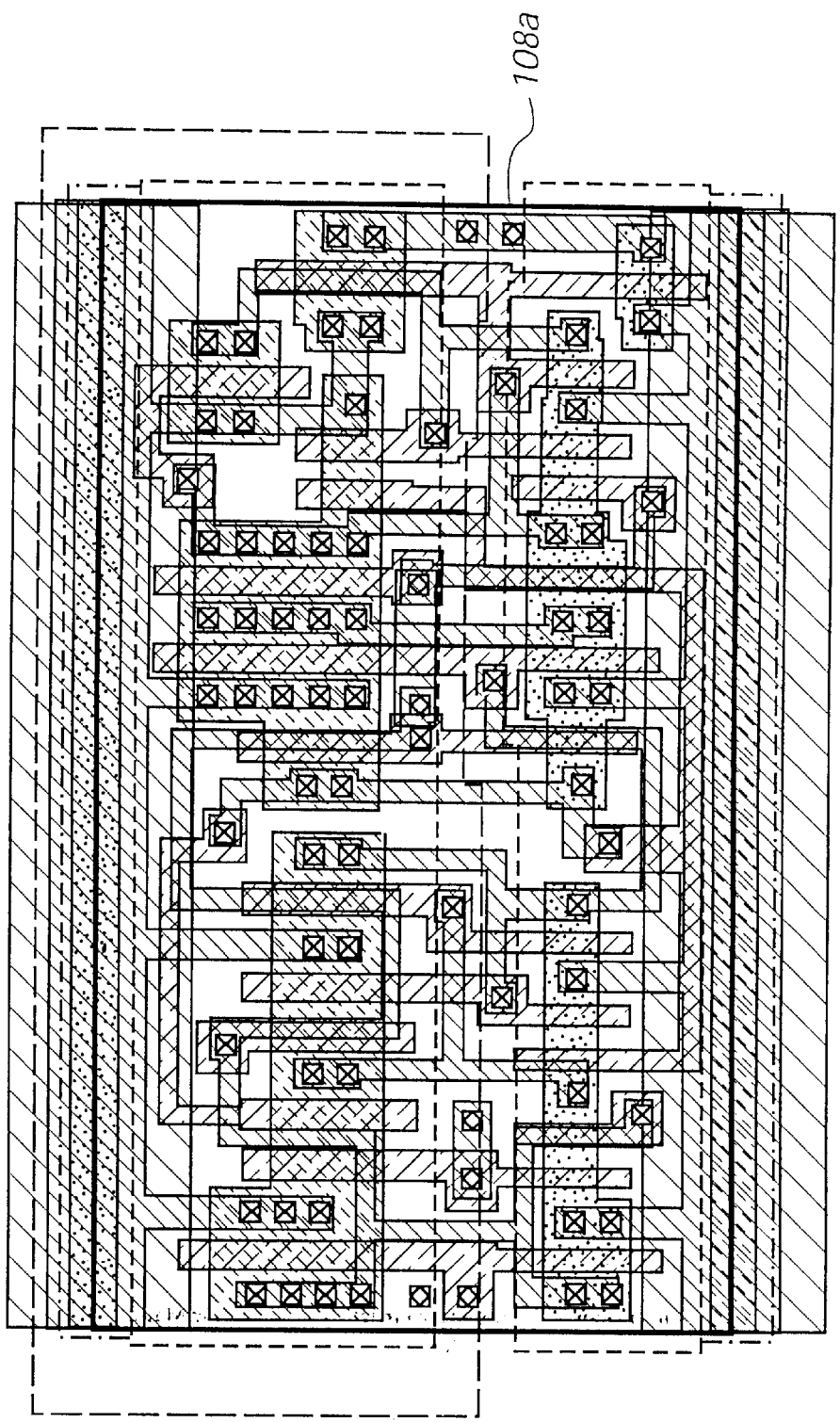

Of course, if the higher resistances are dealt with by adding additional metal strapping power buses 106, there is no need to add a metal-1 power bus 414b as shown in FIG. 8. FIG. 9 illustrates a diagram of the diffusion regions, conductive contacts 413, and the interconnect metallization pins 412c that were shown in FIG. 7. Specifically, the P diffusions 404a, and the N diffusions 404b of FIG. 5 are shown adjacent to N-type implants 418a and P-type implants 418b, respectively. Also illustrated is an N-well 416 which is formed under the P implant 418a and the N diffusions 404b. For completeness, FIG. 10 illustrates the overlaying of each of the aforementioned layers illustrated in FIGS. 5 through 9. Of course, for simplicity, these illustrated layers are shown without their fabricated dielectric layers and other standard fabrication layers that are used when an actual silicon chip is made.

FIGS. 11 through 16 illustrate selected layers of a NAND2 gate standard cell 108b implementing local interconnect metallization in accordance with one embodiment of the present invention. Initially, FIG. 11 shows the NAND gate standard cell 108b having P-type diffusion regions 404a and N-type diffusion regions 404b. FIG. 12 illustrates the NAND2 gate standard cell 108b having polysilicon lines 408 that define the transistor gates and some of the interconnections for the cell. FIG. 13 illustrates the local interconnect metallization lines 412a used to make the interconnections for the NAND2 gate, the pin connections 412c, and the power bus connections 412b.

FIG. 14 illustrates the NAND2 gate standard cell 108b having optional metal 1 (M-1) power bus lines 414b which may be used to interconnect down to the power buses 412b of FIG. 13 when resistance is an issue in an integrated circuit design, or minimizing the number of power straps 106 is desired (i.e., making wider power strap separations). FIG. 15 illustrates the diffusion regions of the NAND2 gate standard cell 108b in accordance with one embodiment of the present invention. Specifically, the P-type diffusion regions 404a, and the N-type diffusion regions 404b are illustrated. Additionally, the P-type implants 418b and the N-type implants 418a are depicted on each side of the standard cell.

Defined beneath the P-type implant 418b is an N-well 416. For simplicity, the local interconnect pin connections 412c are also illustrated in this depiction, and also shown in FIG. 13. FIG. 16 illustrates the overlapping of each of the previous layers for the NAND2 standard cell in accordance with one embodiment of the present invention.

Figure 18:
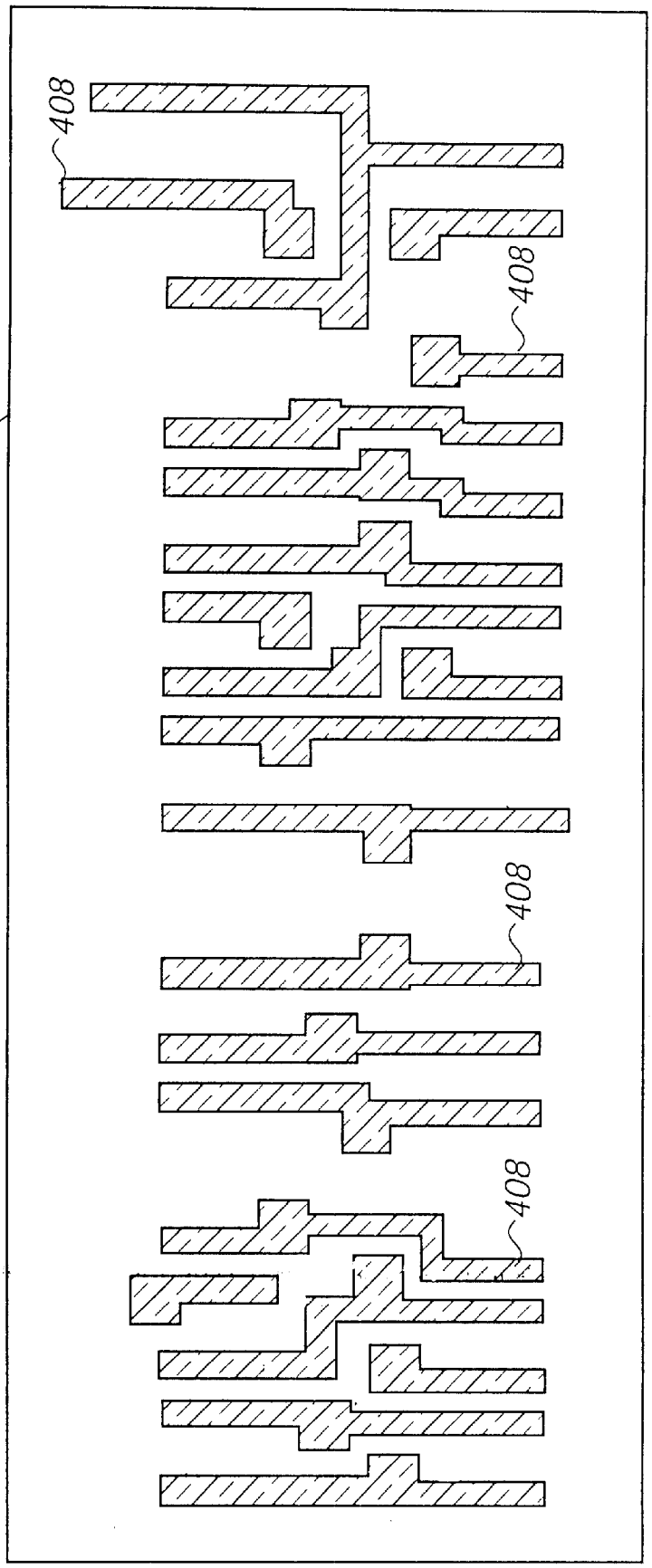

FIGS. 17 through 22 illustrate layers of another exemplary D-flip flop standard cell in accordance with one embodiment of the present invention. Beginning with FIG. 17, a representation of the D-flip flop standard cell 108c having P-type diffusion regions 404a and N-type diffusion regions 404b is illustrated. As mentioned above, the diffusion regions within the center region of the standard cell 108c are used for the source and drains of the transistors designed in the standard cell, while the P and N-type diffusions along the horizontal cell borders are used as substrate diffusion contacts. FIG. 18 illustrates the geometric patterns of the polysilicon lines 408. As mentioned above, the polysilicon lines 408 are used to define the gate electrodes and respective interconnections between the transistor devices.

Figure 19:
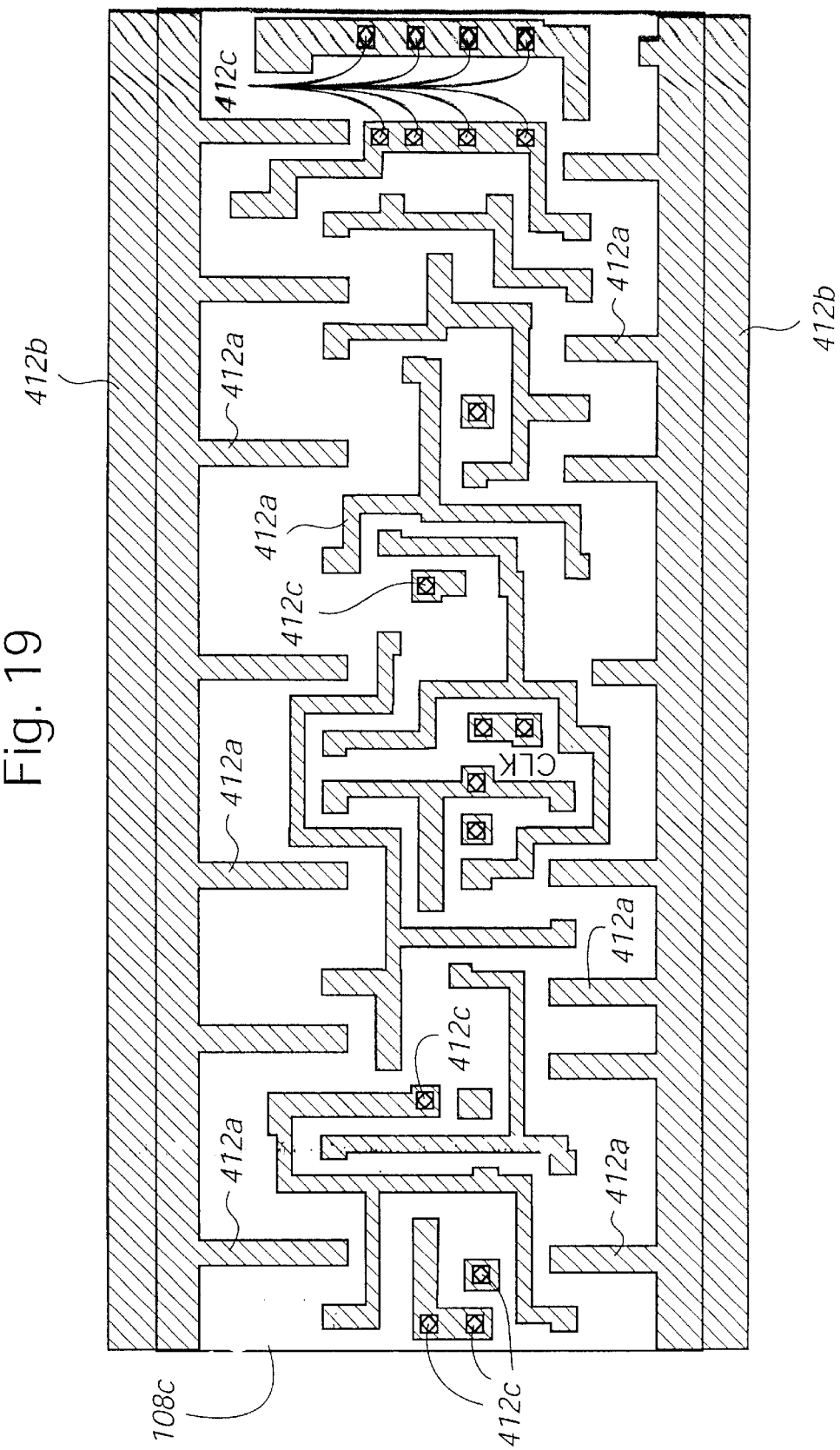

FIG. 19 illustrates the geometric patterns of the local interconnect metallization 412. The local interconnect metallization lines 412a are patterned throughout the inter-region of the standard cell 108c, including representative locations for the local interconnect pins 412c which are used by the place and route software to create logical interconnections. Also shown is the local interconnect power buses 412b which are patterned with the local interconnect metallization materials, such as tungsten.

Figure 20:
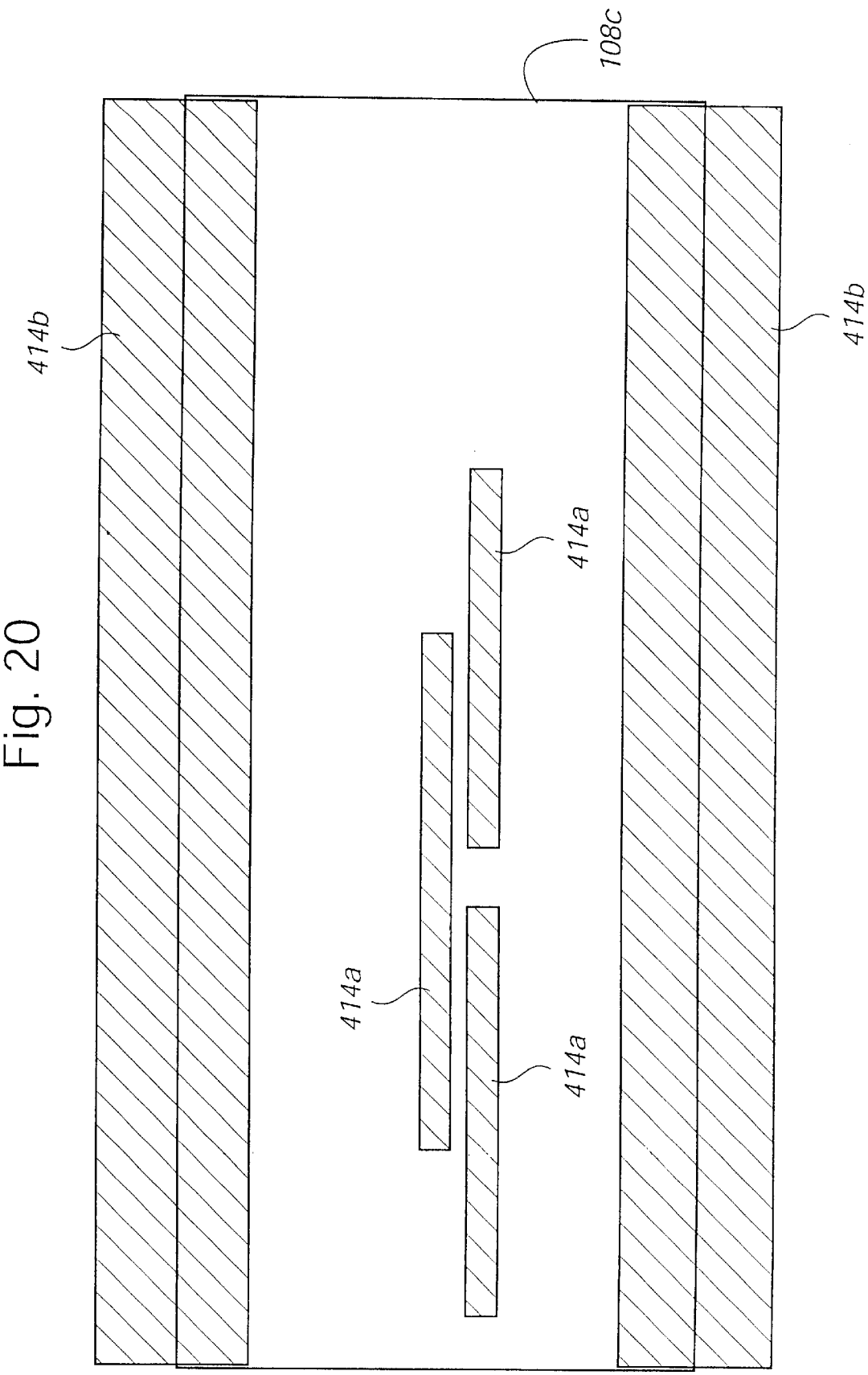

FIG. 20 illustrates the metal 1 (M-1) layer of the D-flip flop standard cell 108c in accordance with one embodiment of the present invention. In the internal region of the standard cell 108c, selected M-1 straps 414a are used to define some of the interconnections for the standard cell layout. As mentioned above, by implementing metal 1 for certain interconnections within the standard cell, size can be reduced, which advantageously reduces the size of an integrated circuit chip. Optionally, the metal 1 layer can also include metal 1 power buses 414b which are designed to be interconnected with the local interconnect power buses 412b of FIG. 19.

Figure 21:
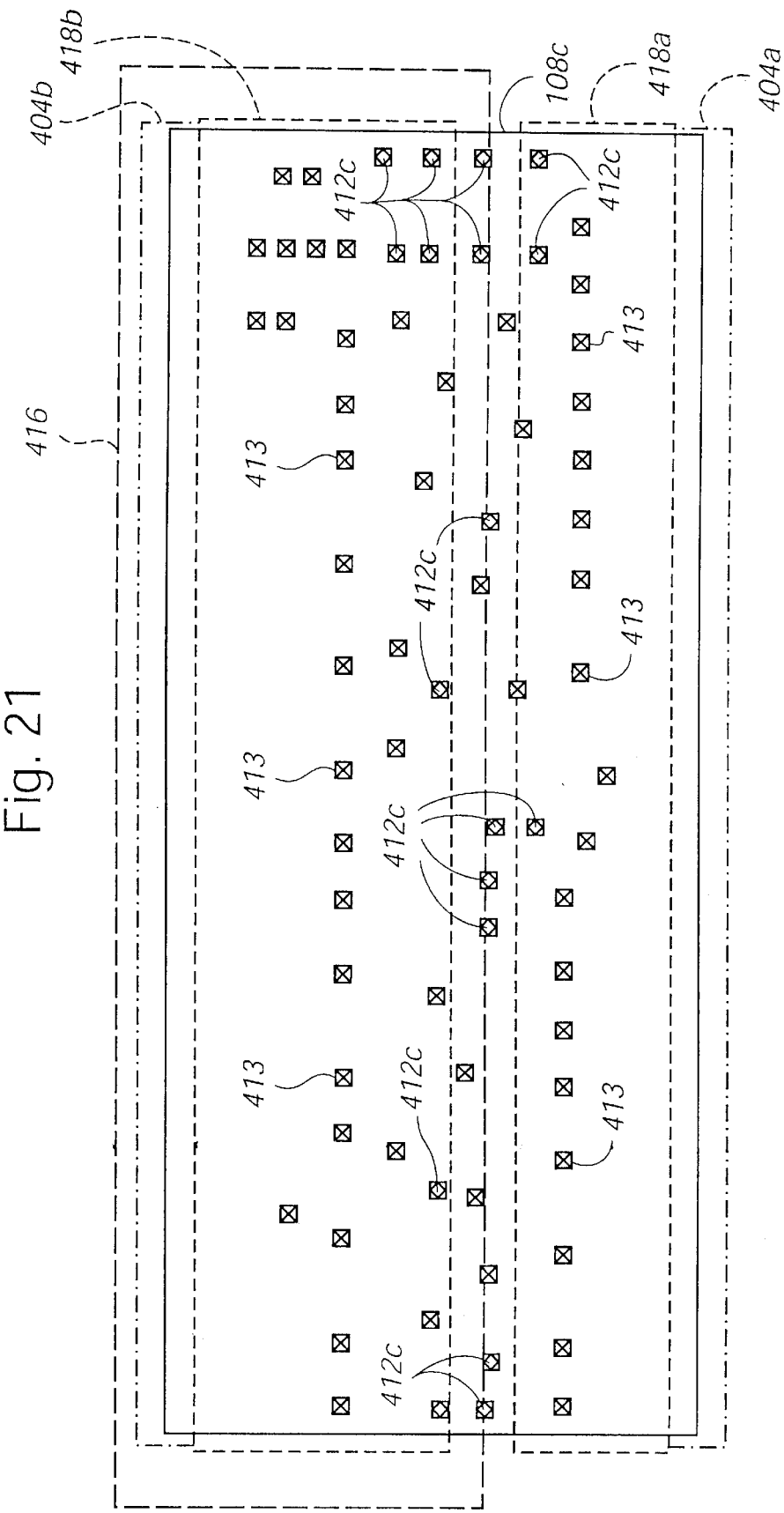
Figure 22:
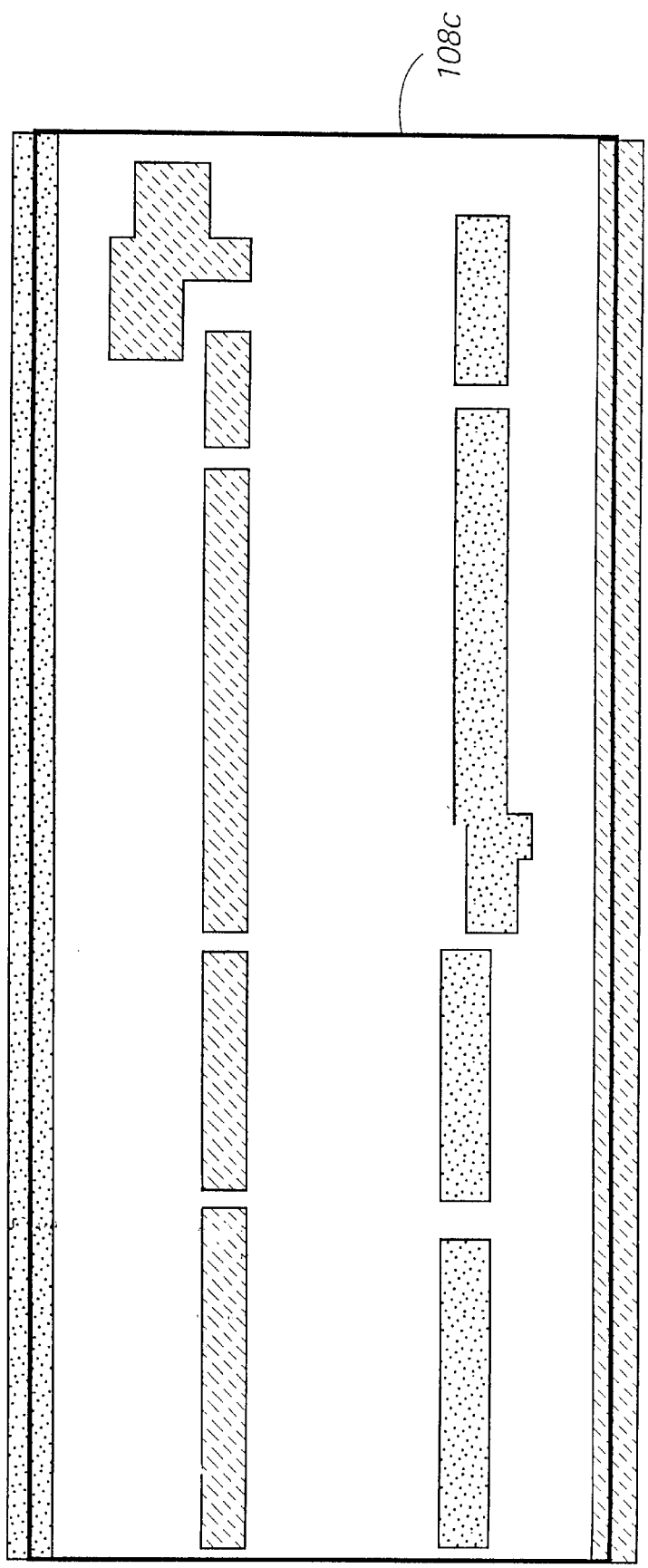

However, if the higher resistance of the local interconnect power buses 414b are mitigated by implementing a suitable number of power bus straps 106, there may not be a need to implement the additional metal 1 power buses 414b. FIG. 21 illustrates the location of the diffusion regions 404a, 404b, 418a, 418b, and an N-well 416. Also depicted are the locations of the local interconnect pins 412c and the conductive vias 413 within the standard cell 108c. FIG. 22 illustrates the overlap of the various layers depicted in FIGS. 17 through 21.

Figure 28:
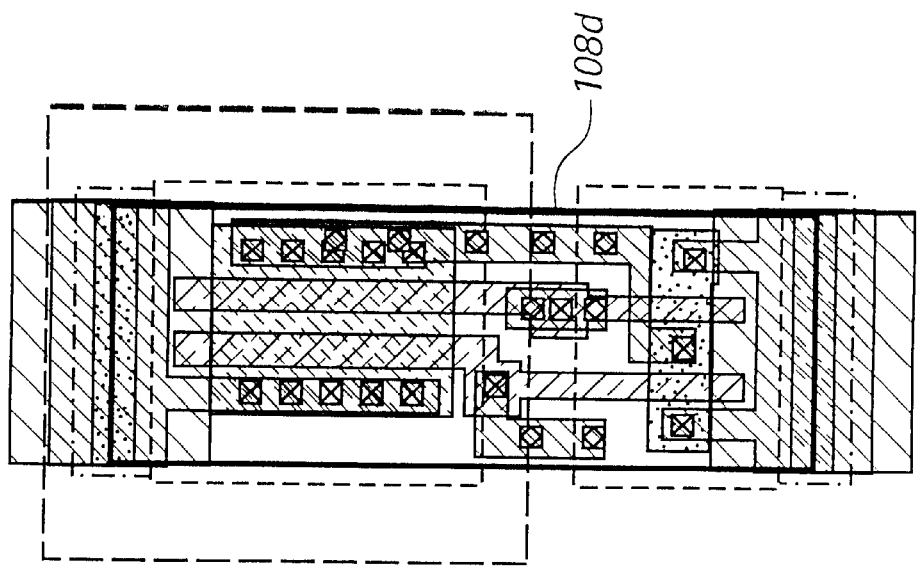
Figure 27:
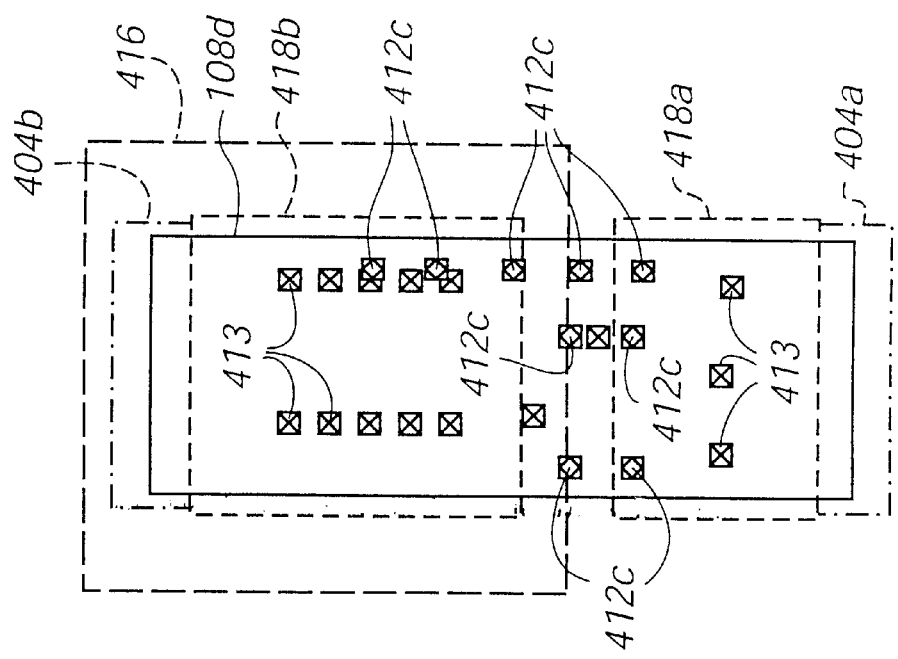

FIGS. 23 through 28 illustrate specific layers of a NOR2 gate standard cell 108d in accordance with one embodiment of the present invention. FIG. 23 illustrates the standard cell 108d having P-type diffusion regions 404a and N-type diffusion regions 404b. FIG. 24 illustrates the standard cell 108d having the polysilicon lines 408 defining the geometries for the transistor gates and selected interconnections. FIG. 25 illustrates the local interconnect metallization 412 used to define local interconnect metallization lines 412a, local interconnect metallization pins 412c, and local interconnect power buses 412b. FIG. 26 illustrates an outline of the standard cell 108d having optional metal 1 power buses 414b. FIG. 27 illustrates the locations of diffusion regions 404a, 404b, 418a, 418b, and N-well 416. Also shown are the locations of the local interconnect metallization pins 412c and selected conductive vias 413. FIG. 28 illustrates the combination of FIGS. 23 through 27.

FIGS. 29 through 34 illustrate selected layers of an inverter gate standard cell 108e in accordance with one embodiment of the present invention. FIG. 29 illustrates P-type diffusion regions 404a and N-type diffusion regions 404b used in the center of the standard cell 108e to define the source and drain regions of the transistor devices. Also shown are the diffusion regions along the cell border that are used as substrate contacts. FIG. 30 illustrates the standard cell 108e having polysilicon lines 408. FIG. 31 illustrates the standard cell 108e having the local interconnect metallization lines 412. Internal within the standard cell 108e, are local interconnect metallization lines 412a which are used to complete the transistor interconnections. Further illustrated are the local interconnect metallization pins 412c and the local interconnect metallization buses 412b.

Figure 34:
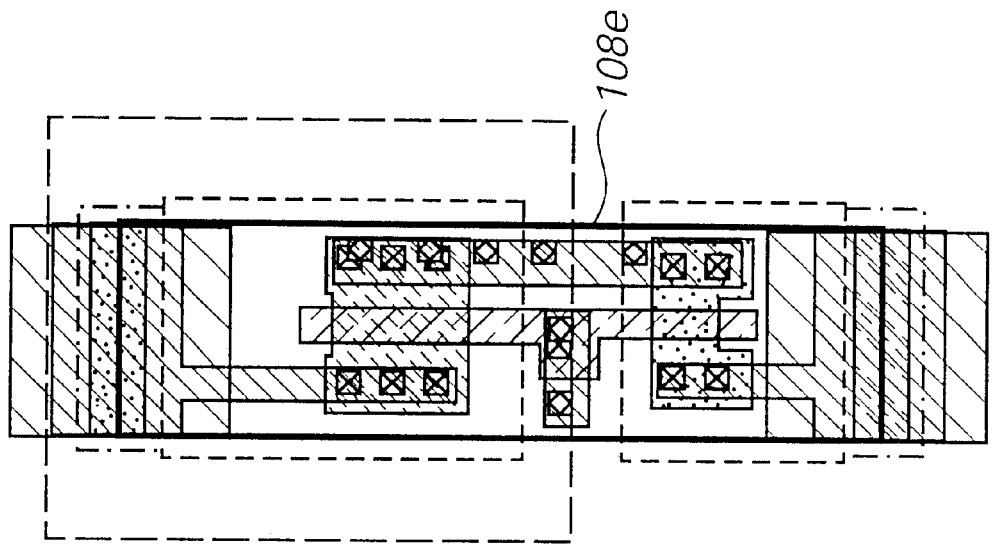
Figure 33:
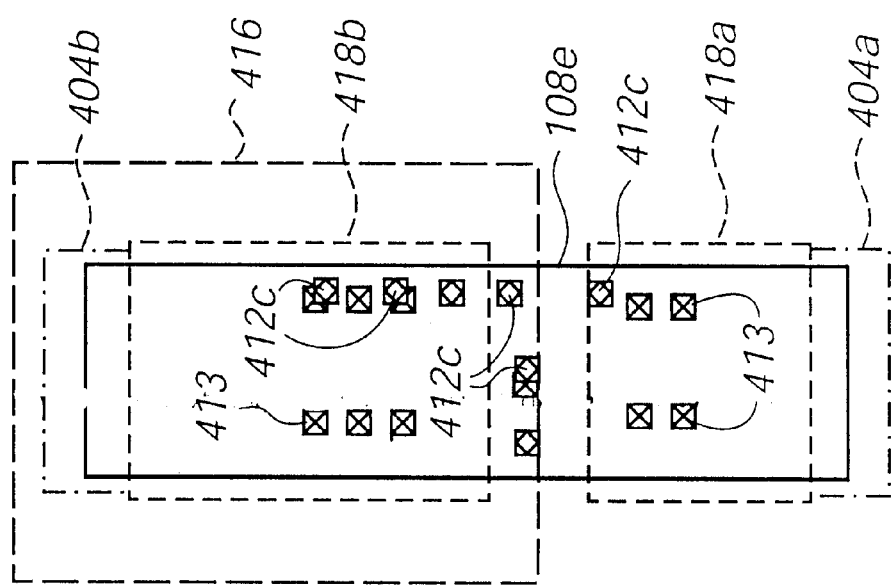

FIG. 32 illustrates the standard cell 108e having optional metal 1 power buses 414b. FIG. 33 illustrates the locations of diffusion regions 404a, 404b, 418a, 418b, and an N-well 416. Also illustrated are the locations of the local interconnect metallization pins 412c and selected conductive vias 413. FIG. 34 illustrates the overlapping of each of the layers illustrated in FIGS. 29 through 33.

Figure 35:
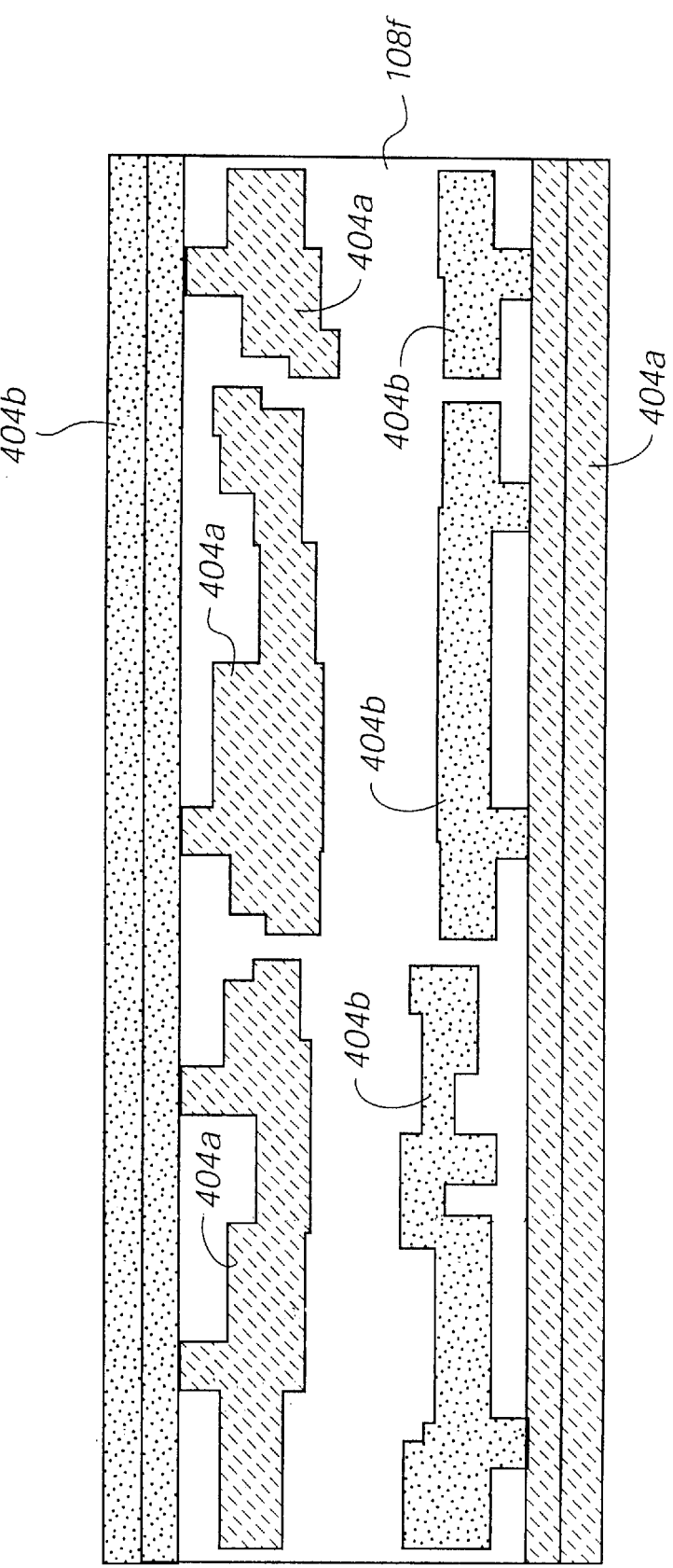
Figure 36:
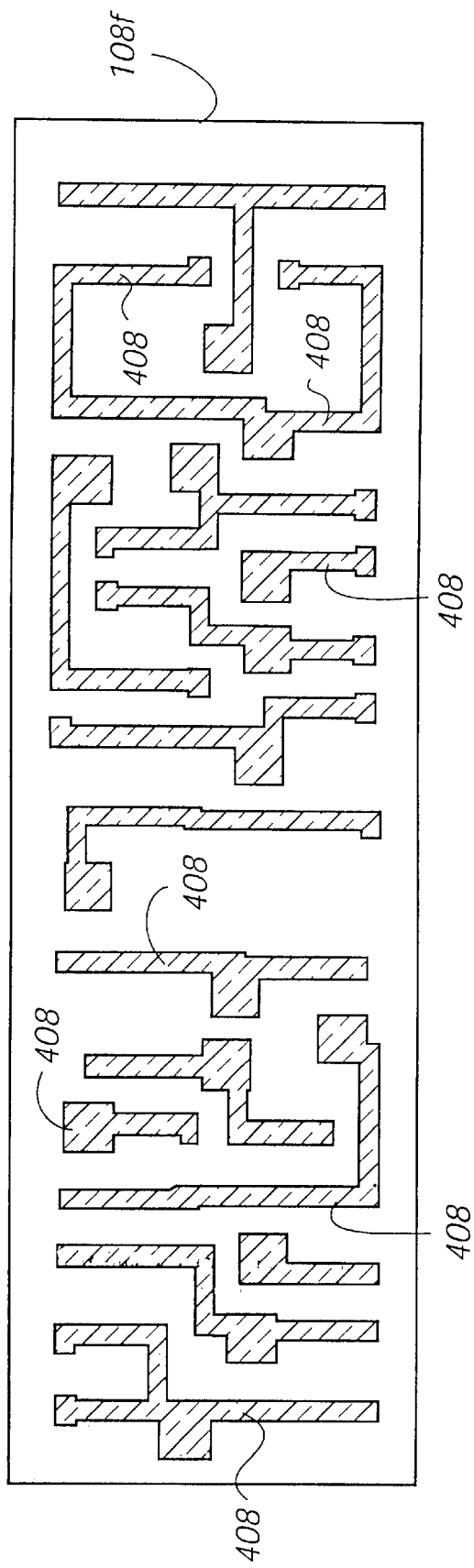

FIGS. 35 through 58 illustrate embodiments in which the standard cells do not used metal 1 to connect up with the local interconnect power buses 412b in accordance with an alternative embodiment of the present invention. Reference will now be drawn to FIGS. 35 through 40 which illustrate a D-flip flop standard cell 108f which does not utilize a metal 1 power bus. FIG. 35 illustrates P-type diffusion regions 404a, and N-type diffusion regions 404b. FIG. 36 illustrates the polysilicon lines 408 which make up the gate electrodes and selected interconnections for the standard cell 108f. FIG. 37 illustrates the local interconnect metallization 412 which is used in the standard cell 108f. Specifically, the local interconnect metallization lines 412a are used to route and interconnect selected transistor devices that are formed in the substrate of the device. Also formed on the local interconnect metallization layer are the local interconnect metallization pins 412c and the local interconnect metallization power buses 412b.

Figure 39:
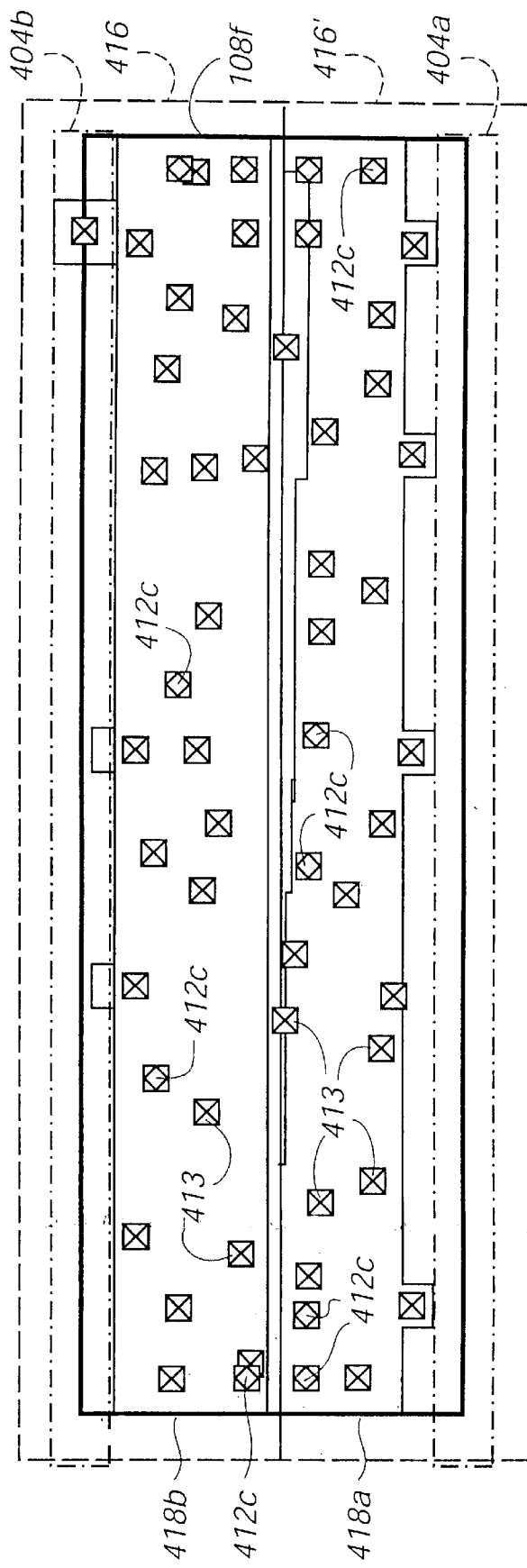
Figure 40:
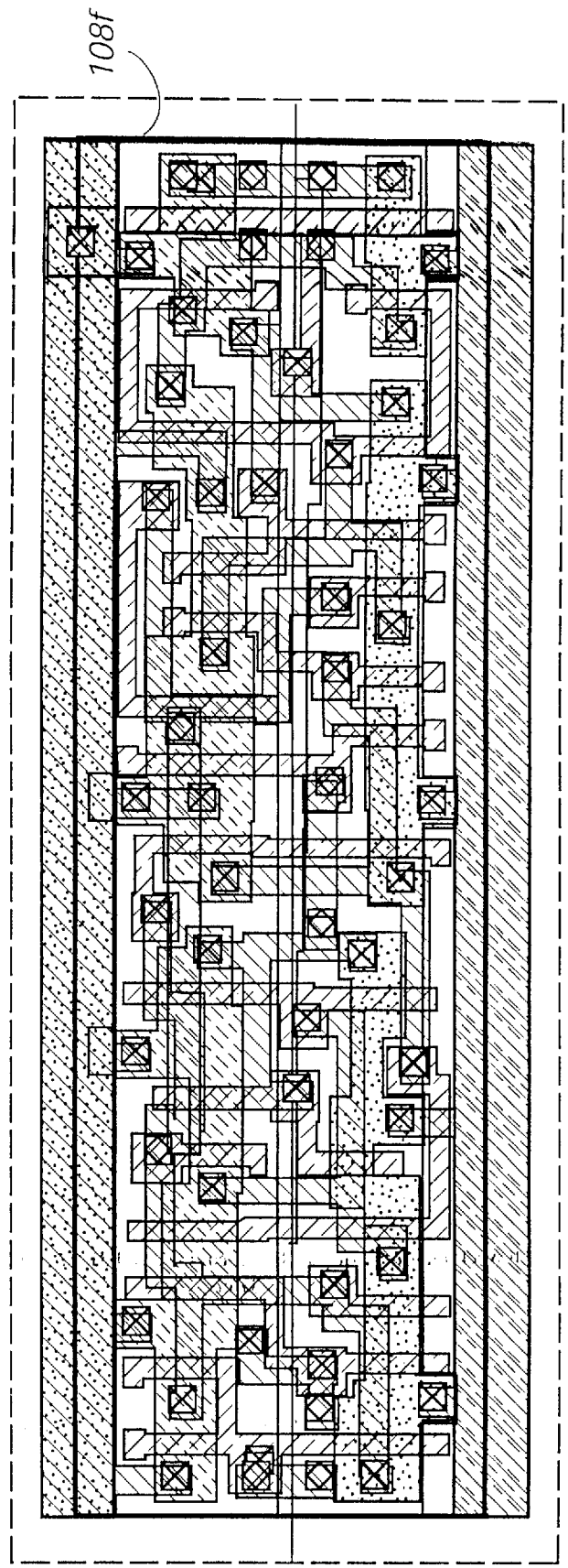

FIG. 38 illustrates the standard cell 108f having selected metal 1 straps 414a which are used to complete selected interconnections of the standard cell. By implementing selected strap metallization lines 414a, the size of the standard cell 108f can be reduced in both the width and the height. It should also be noted that the power buses 414b of the previous embodiment have not been included in FIG. 38. However, the separation of the power buses 106 of FIG. 1B may have to be designed slightly closer together to reduce the possibility of current crowding in a highly resistive local interconnect metallization power bus design. FIG. 39 illustrates diffusion regions 404a, 404b, 418a, 418b, and an N-well 416. Also provided in this design is an example of a P-well 416'.—Further illustrated are the locations of the local interconnect metallization pins 412c and selected conductive vias 413. FIG. 40 illustrates the overlapping of the layers illustrated in FIGS. 35 through 39.

Figure 41:
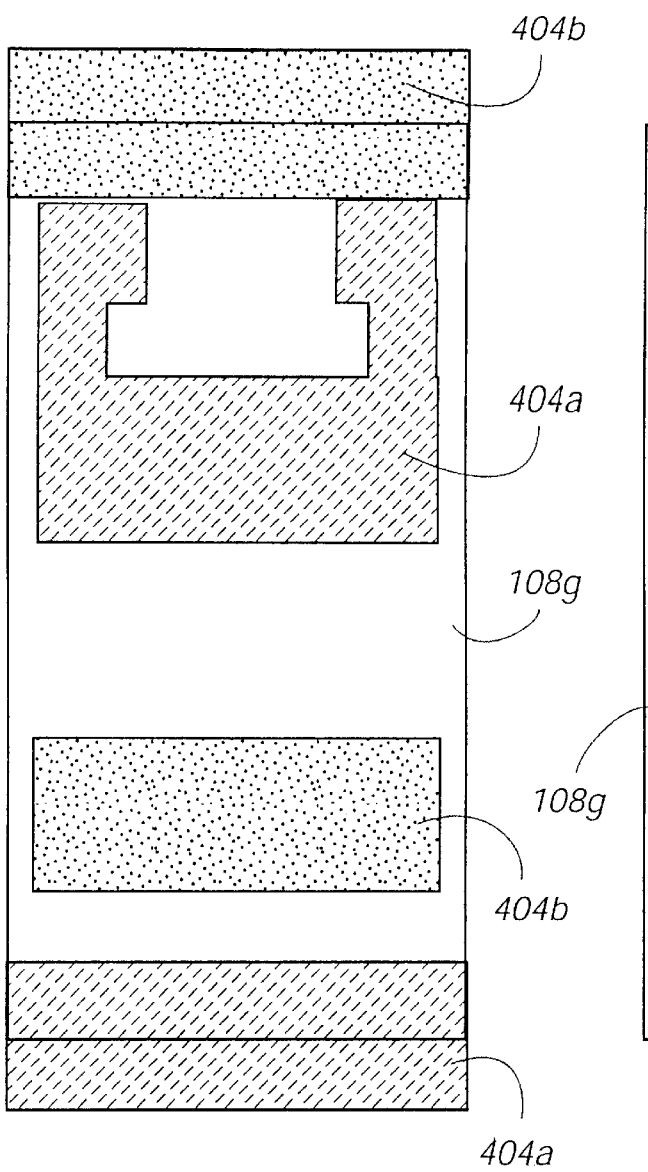
FIGS. 41 through 46 illustrate layered diagrams of a NAND2 standard cell in accordance with one embodiment of the present invention.
Figure 42:
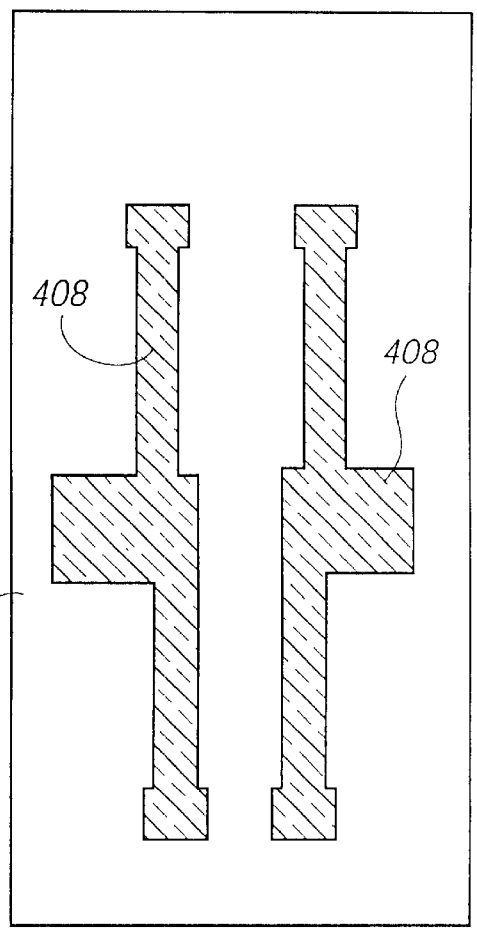
Figures 43, 44:
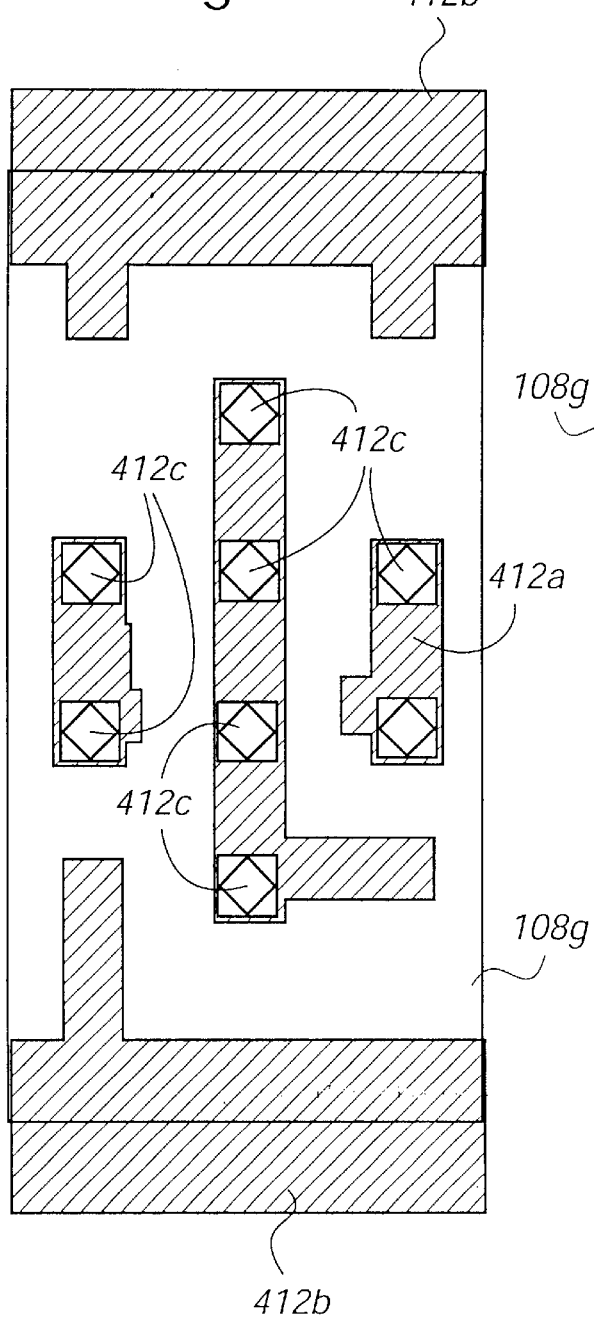
Figure 45:
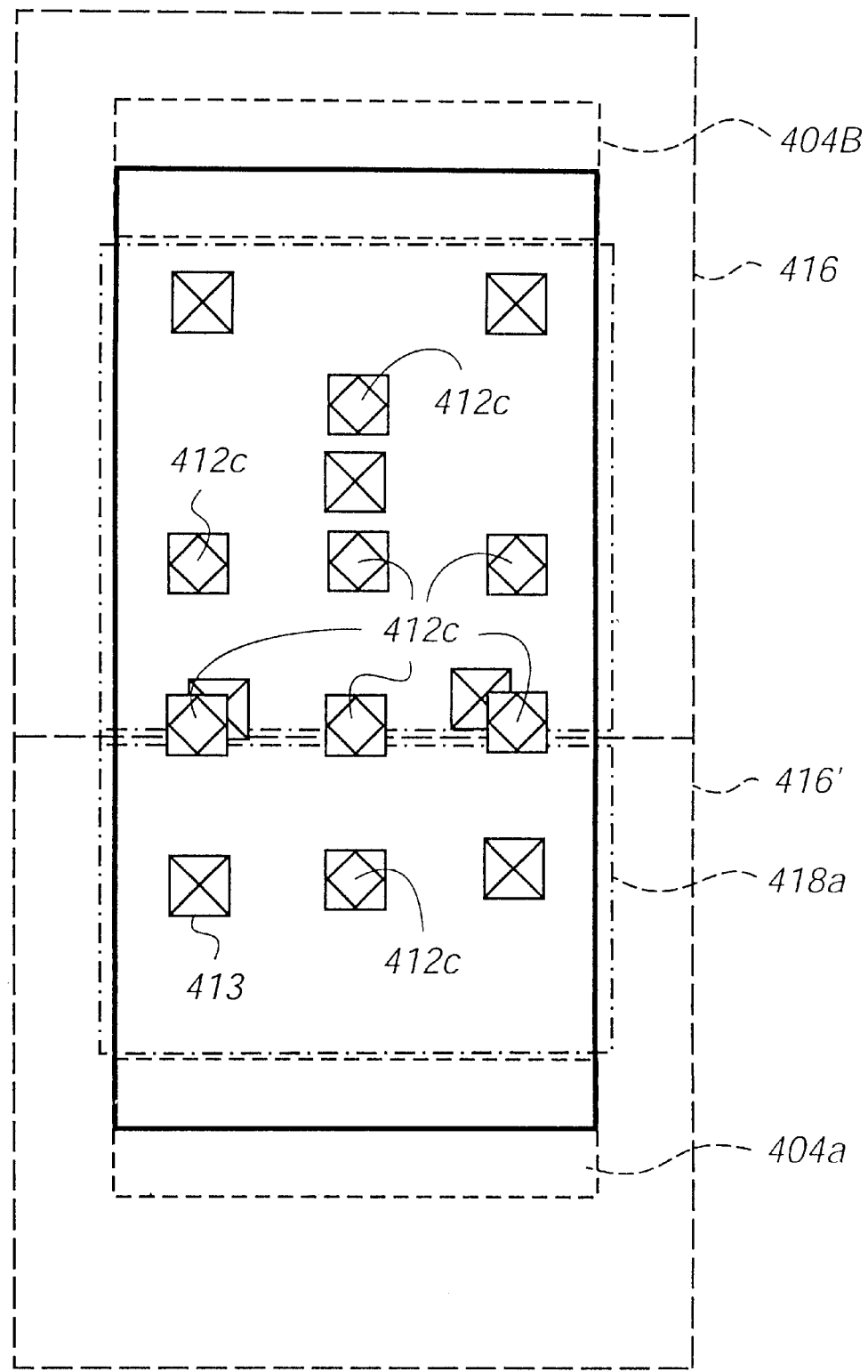
Figure 46:
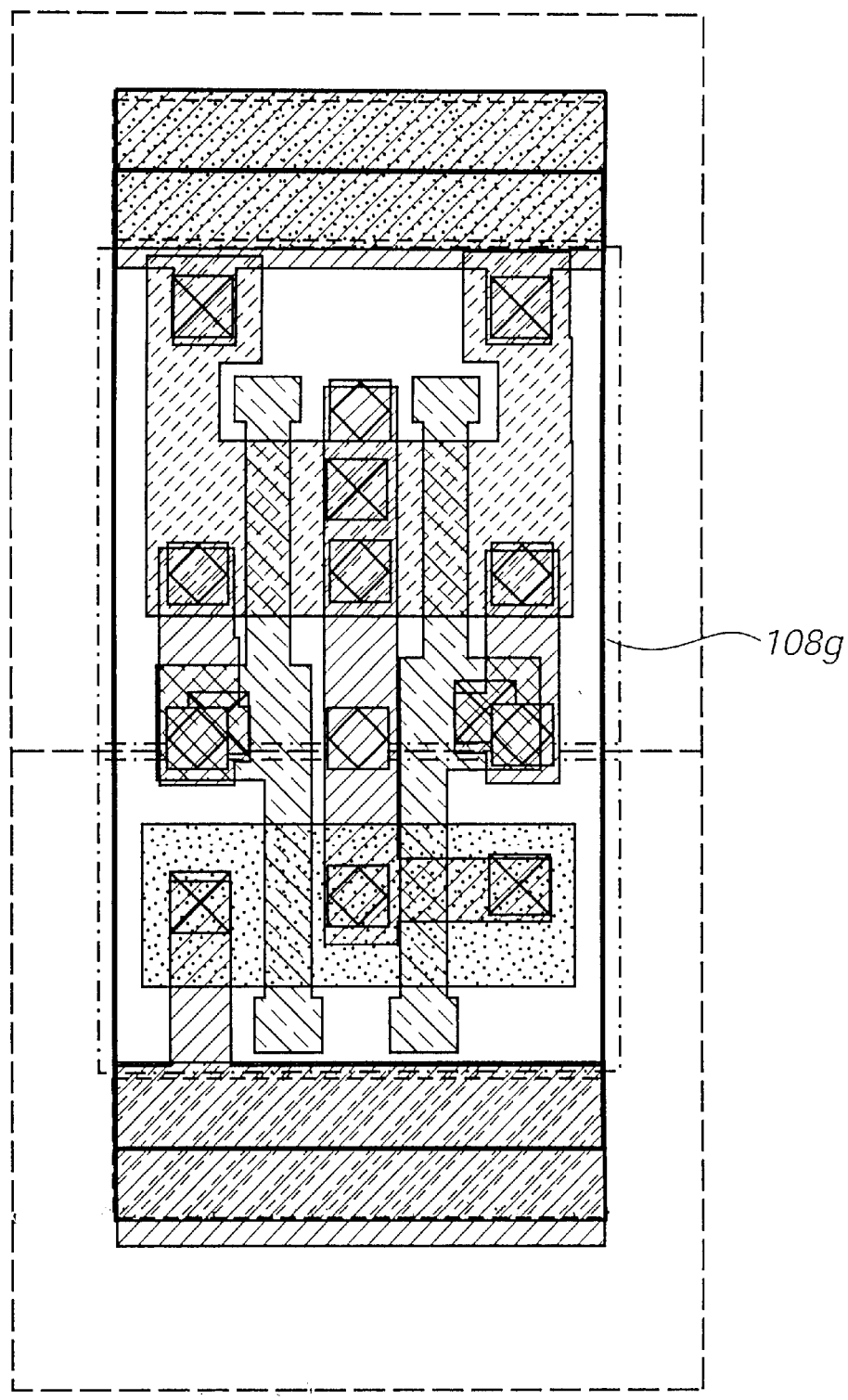

FIGS. 41 through 46 illustrate layered diagrams of a NAND2 standard cell 108g in accordance with one embodiment of the present invention. FIG. 41 illustrates the standard cell 108g having P-type diffusion regions 404a and N-type diffusion regions 404b. FIG. 42 illustrates the polysilicon lines 408 of the standard cell 108g. FIG. 43 illustrates the local interconnect metallization that is used to form interconnect lines 412a, place and route pins 412c, and local interconnect metallization power buses 412b. FIG. 44 illustrates a box outline of the standard cell 108g, which illustrates that no metal 1 is used to complete the routing for this standard cell. Additionally, it should be noted, in this embodiment, that metal 1 is not used to route a power bus at each end of the standard cell, and power bus routing is completed by the interconnect metallization power bus 412d of FIG. 43. FIG. 45 illustrates the diffusion regions 404a, 404b, 418a, 418b, and an N-well 416. Also shown is a P-well implant 416'. For ease of reference, the location of the interconnect metallization pins 412c are also shown in this diagram of standard cell 108g. FIG. 46 illustrates the combination of layers identified in FIGS. 41 through 45.

Figure 51:
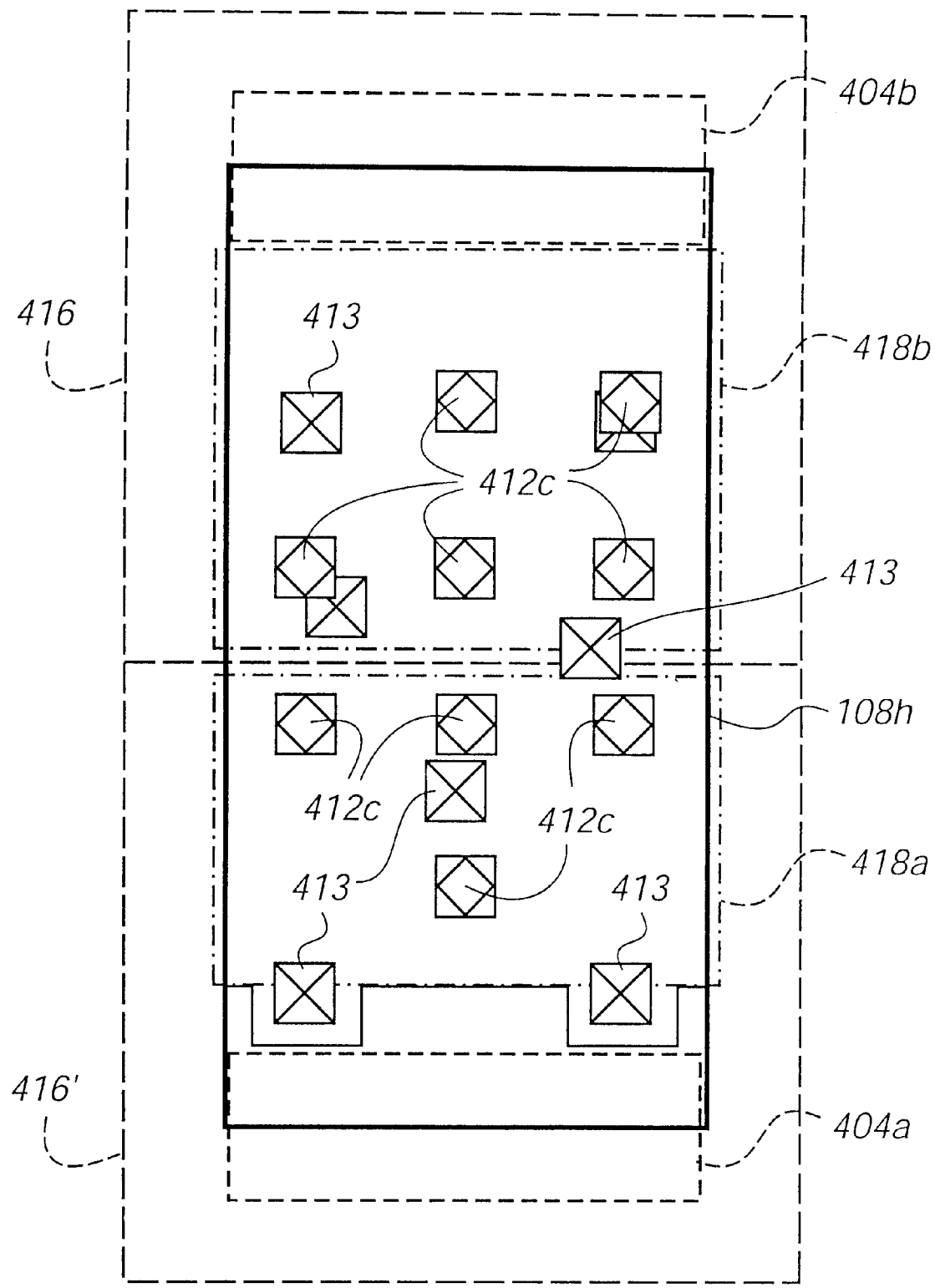
Figure 52:
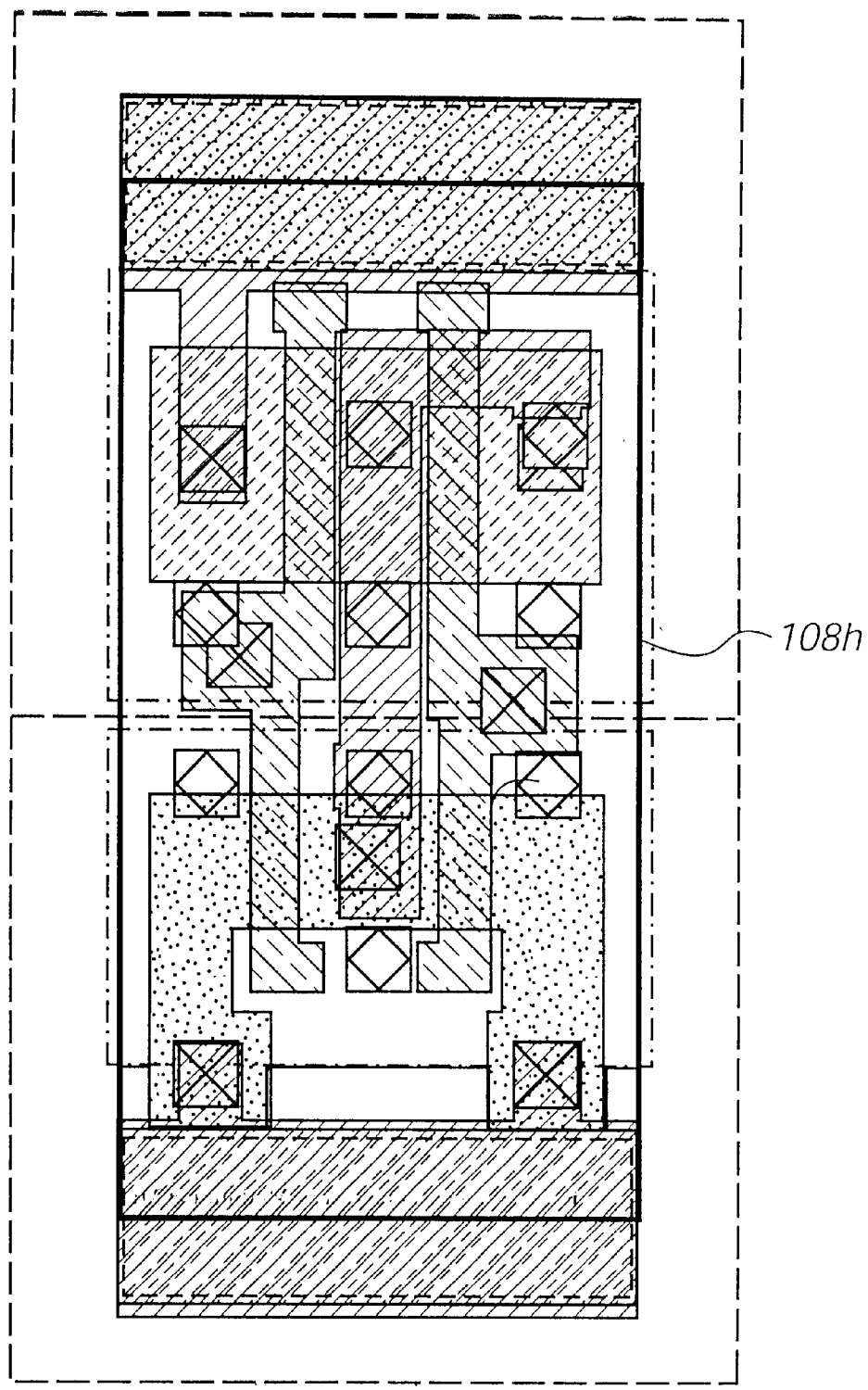

FIGS. 47 through 52 illustrate layers of a NOR2 standard cell 108h in accordance with one embodiment of the present invention. FIG. 47 illustrates the P-type diffusion regions 404a and N-type diffusion regions 404b. FIG. 48 illustrates the polysilicon lines 408 that are used to define the transistor gates and selected interconnections. FIG. 49 illustrates the local interconnect metallization 412 that is used to define local interconnection lines 412a, local interconnect power buses 412b, and local interconnect pins 412c. As mentioned before, the local interconnect pins 412c are used by the place and route software to electrically interconnect the standard cells to form the desired electrical circuit. FIG. 50 illustrates an outline of the standard cell 108h wherein no metal 1 is used to complete the interconnections of the standard cell. FIG. 51 illustrates the diffusion regions 404a, 404b, 418a, 418b, and the N-well 416. The standard cell is also shown having a P-well 416'. Additionally, the location of the local interconnect pins 412c and the conductive vias 413 are shown. FIG. 52 illustrates the overlapping of FIGS. 47 through 51 for the NOR2 standard cell 108h.

FIGS. 53 through 58 illustrate the various layers of an inverter standard cell 108i in accordance with one embodiment of the present invention. FIG. 53 illustrates the P-type diffusion regions 404a and N-type diffusion regions 404b of the standard cell 108i. FIG. 54 illustrates the polysilicon line 408 that is used to define the transistor gates and associated interconnections for the standard cell 108i.

Figure 57:
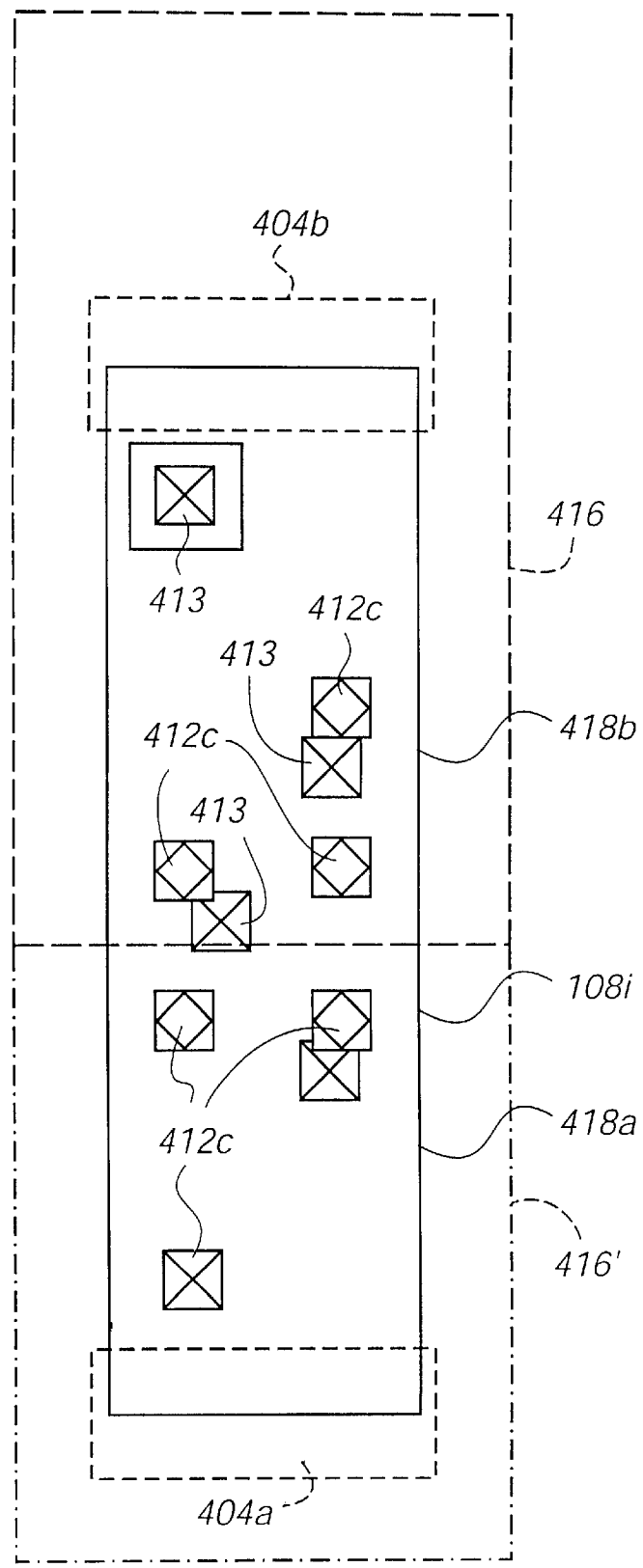

FIG. 55 illustrates the local interconnect metallization layer 412 which is used to define the local interconnect lines 412a of the standard cell 108i. Additionally, the local interconnect power buses 412b are shown at each end of the standard cell, and the local interconnect pins 412c that may be used by the place and route software are also illustrated. FIG. 56 illustrates an outline of the standard cell 108i, that does not implement metal-1 lines to complete the cell interconnections of the inverter gate. FIG. 57 illustrates the diffusion regions of the standard cell 108i. Specifically, diffusion regions 404a, 404b, 418a, and 418b are shown. Also illustrated is an N-well 416 and an associated P-well 416'. To simplify the illustration, the metallization interconnect pins 412c are also shown in their respective locations along with associated conductive vias 413. FIG. 58 illustrates the overlapping of layers illustrated in FIGS. 53 through 57.

Although the foregoing invention has been described in some detail for purposes of clarity of understanding, it will be apparent that certain changes and modifications may be practiced within the scope of the appended claims. It should therefore be understood that the various circuit diagrams may be embodied in other forms which may include, for example, any suitable semiconductor substrate, packaged integrated circuit, or associated software "place and route" implementation. Accordingly, the present embodiments are to be considered as illustrative and not restrictive, and the invention is not to be limited to the details given herein, but may be modified within the scope and equivalents of the appended claims.

What is claimed is:

1. A semiconductor standard cell architecture, comprising:

a semiconductor substrate having diffusion regions that are designated for source and drain regions of a functional circuit of the semiconductor standard cell architecture;

a polysilicon layer being patterned to define gate electrodes and interconnections of the semiconductor standard cell architecture;

a first dielectric layer having a first dielectric thickness disposed over the polysilicon layer;

a local interconnect metallization layer that is patterned into a plurality of local interconnect metallization lines that are disposed over the dielectric layer and is configured to substantially interconnect the source and drain regions and gate electrodes to define the functional circuit within the semiconductor standard cell architecture, the plurality of local interconnect metallization lines are further designed to incorporate local interconnect metallization pins that are connection points for interconnecting the functional circuit to another functional circuit, wherein the local interconnect metallization layer is a higher resistivity metal having lower electromigration than aluminum; and a second dielectric layer disposed over the local interconnect metallization layer, the second dielectric layer having a second dielectric thickness that is at least equal to the first dielectric thickness.

2. A semiconductor standard cell architecture as recited in claim 1, wherein the higher resistivity metal is a tin alloy metal.

3. A semiconductor standard cell architecture as recited in claim 2, wherein the higher resistivity metal is selected from a group consisting of a tungsten metal, tin alloy metal, and a tungsten containing metal.

4. A semiconductor standard cell architecture as recited in claim 1, wherein the plurality of local interconnect metallization lines further define local interconnect metallization power buses.

5. A semiconductor standard cell architecture as recited in claim 4, wherein the semiconductor standard cell architecture is used to define a library having a plurality of standard cells.

6. A semiconductor standard cell architecture as recited in claim 2, wherein the higher resistivity metal is selected to have a resistivity that is greater than about 0.1 Ohms/square.

7. A semiconductor standard cell architecture as recited in claim 6, wherein each one of the plurality of local interconnect metallization lines is configured to have a resistance that is less than about 100 Ohms.

8. A semiconductor standard cell architecture as recited in claim 4, further comprising:
    a first aluminum based metallization layer that is patterned to define a plurality of first metallization lines, wherein at least one of the plurality of first metallization lines define a metal strap that is configured to complete the functional circuit and reduce one of a horizontal width and a vertical height of the semiconductor standard cell architecture.

9. A semiconductor standard cell architecture as recited in claim 8, wherein some of the plurality of first metallization lines define metal-1 power buses that are electrically interconnected to the local interconnect metallization power buses of the local interconnect metallization layer.

10. A semiconductor standard cell architecture as recited in claim 5, wherein the plurality of standard cells include a D-Flip Flop cell, a NAND gate, a NOR gate, and an inverter gate.

11. A semiconductor cell having a standard architecture, the semiconductor cell is part of a library of cells that are accessible to a place and route layout tool to complete a semiconductor functional circuit on a semiconductor chip, the semiconductor cell comprising:
    a plurality of diffusion regions that designate source and drain regions of transistors of the semiconductor functional circuit;
    a polysilicon layout defining gate electrodes and interconnections of the semiconductor functional circuit;
    a first dielectric layer having a first dielectric thickness disposed over the polysilicon layout;
    a local interconnect metallization layout that is patterned to define a plurality of local interconnect metallization lines that are configured to substantially interconnect selected ones of the source and drain regions and gate electrodes to at least partially define the semiconductor functional circuit, the local interconnect metallization layout is embodied in a material having a resistivity of at least about 0.1 Ohms/square; and
    a second dielectric layer disposed over the local interconnect metallization layer, the second dielectric layer having a second dielectric thickness that is at least equal to the first dielectric thickness.

12. A semiconductor cell having a standard architecture as recited in claim 11, wherein the plurality of local interconnect metallization lines are further designed to incorporate local interconnect metallization pins that are connection points for the place and route layout tool that enable an interconnection of the semiconductor cell to another semiconductor cell.

13. A semiconductor cell having a standard architecture as recited in claim 12, wherein the material is a higher resistivity metal.

14. A semiconductor cell having a standard architecture as recited in claim 13, wherein the higher resistivity metal is selected from a group consisting of a tungsten metal, a tin alloy metal, and a tungsten containing metal.

15. A semiconductor cell having a standard architecture as recited in claim 11, wherein the plurality of local interconnect metallization lines further define local interconnect metallization power buses.

16. A semiconductor cell having a standard architecture as recited in claim 11, further comprising:
    a first aluminum based metallization layout that is patterned to define a plurality of first metallization lines; and
    wherein at least one of the plurality of first metallization lines define a metal strap that is configured to complete the semiconductor cell and reduce one of a horizontal width and a vertical height of the semiconductor cell.

17. A semiconductor cell having a standard architecture as recited in claim 16, wherein some of the plurality of first metallization lines define metal-1 power buses that are electrically interconnected to the local interconnect metallization power buses of the local interconnect metallization layout.

18. A semiconductor standard cell architecture, comprising:
    a semiconductor substrate having diffusion regions that are designated for source and drain regions of a functional circuit of the semiconductor standard cell architecture;
    a polysilicon layer being patterned to define gate electrodes and interconnections of the semiconductor standard cell architecture;
    a first dielectric layer having a first dielectric thickness disposed over the polysilicon layer;
    a local interconnect metallization layer that is patterned into a plurality of local interconnect metallization lines that are disposed over the dielectric layer and is configured to substantially interconnect the source and drain regions and gate electrodes to define the functional circuit within the semiconductor standard cell architecture, the plurality of local interconnect metallization lines are further designed to incorporate local interconnect metallization pins that are connection points for interconnecting the functional circuit to another functional circuit, wherein the local interconnect metallization layer is a higher resistivity metal selected from a group consisting of tungsten metal and a tin alloy metal; and
    a second dielectric layer disposed over the local interconnect metallization layer, the second dielectric layer having a second dielectric thickness that is at least equal to the first dielectric thickness.

* * * * *